(12) United States Patent
Otsuka et al.

(10) Patent No.: US 9,505,210 B2
(45) Date of Patent: Nov. 29, 2016

(54) LIQUID DISCHARGE APPARATUS, HEAD UNIT, AND CONTROL METHOD OF LIQUID DISCHARGE APPARATUS

(71) Applicant: Seiko Epson Corporation, Tokyo (JP)

(72) Inventors: Shuji Otsuka, Shiojiri (JP); Tadashi Kiyuna, Hachioji (JP); Toshifumi Asanuma, Hamura (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/592,279

(22) Filed: Jan. 8, 2015

(65) Prior Publication Data

US 2015/0197083 A1    Jul. 16, 2015

(30) Foreign Application Priority Data

Jan. 16, 2014    (JP) .................................. 2014-005663

(51) Int. Cl.
*B41J 2/15*      (2006.01)
*B41J 2/045*     (2006.01)

(52) U.S. Cl.
CPC ......... *B41J 2/04541* (2013.01); *B41J 2/04573* (2013.01); *B41J 2/04581* (2013.01); *B41J 2/04588* (2013.01)

(58) Field of Classification Search
CPC ............ B41J 2002/14491; B41J 2002/14217; B41J 2002/14225; B41J 2002/14258; B41J 2002/14266; B41J 2/07
See application file for complete search history.

(56) References Cited

U.S. PATENT DOCUMENTS 8,083,309 B2 * 12/2011 Umeda ................ B41J 2/04541
                                                    347/10
8,845,052 B2 *  9/2014 Tamura ..................... B41J 2/07
                                                    347/11

FOREIGN PATENT DOCUMENTS

JP        2004-363997 A    12/2004

* cited by examiner

*Primary Examiner* — Lamson Nguyen
(74) *Attorney, Agent, or Firm* — Harness, Dickey & Pierce, P.L.C.

(57) ABSTRACT

A liquid discharge apparatus includes: an original drive signal generator that generates a plurality of original drive signals which includes a first original drive signal and a second original drive signal; a selection section that is capable of selecting one original drive signal from the plurality of original drive signals which includes the first original drive signal and the second original drive signal; a driver that generates a drive signal of voltages in accordance with the one original drive signal; a piezoelectric element that is displaced according to the drive signal; a cavity of which an inside volume is changed due to the displacement of the piezoelectric element; and a nozzle that is provided to discharge a liquid in the cavity according to the change of the inside volume of the cavity.

5 Claims, 26 Drawing Sheets

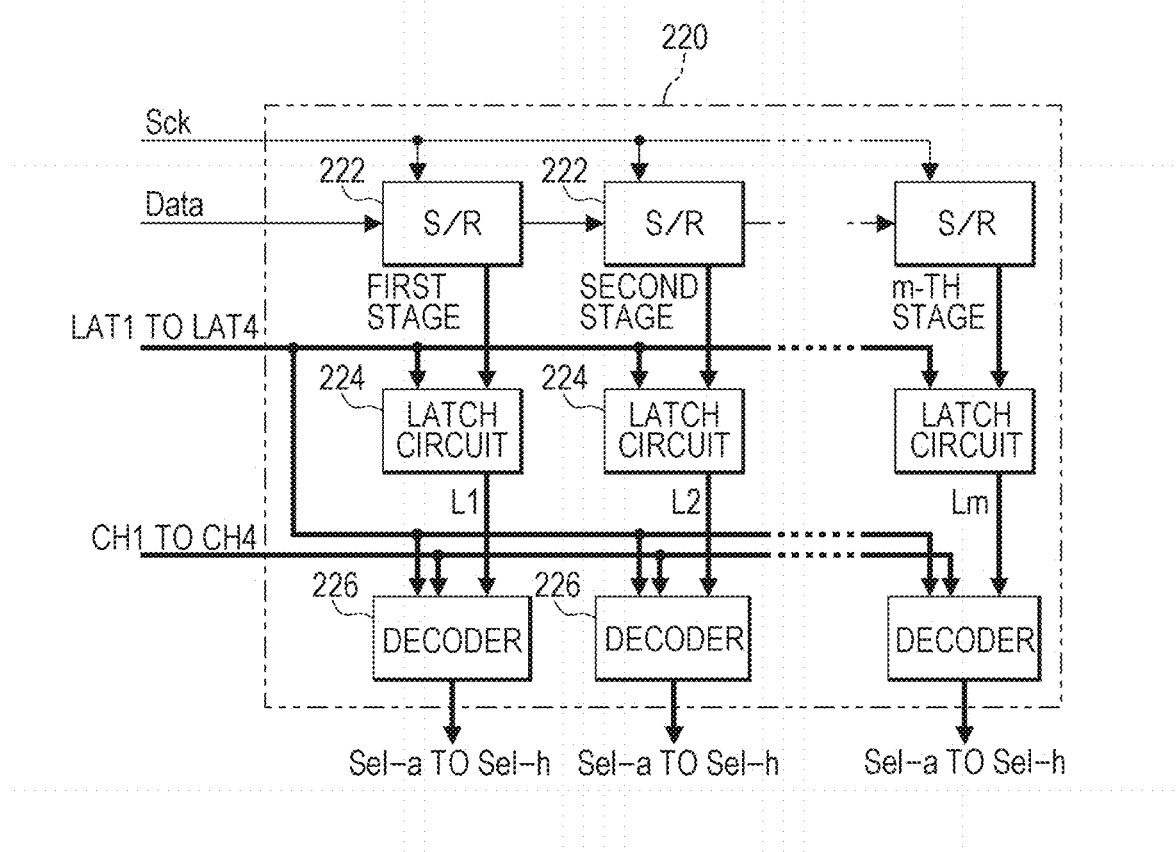

FIG. 8

<DECODED DETAILS OF DECODER>

| DATA SIGNAL Data | | PERIOD | SELECTION SIGNAL | | | | | | | |
|---|---|---|---|---|---|---|---|---|---|---|
| | | | Sel-a | -b | -c | -d | -e | -f | -g | -h |
| FIRST SYSTEM | LARGE DOT | T1 | H | L | | | | | | |
| | | T2 | H | L | | | | | | |
| | MEDIUM DOT | T1 | H | L | | | | | | |
| | | T2 | L | H | | | | | | |
| | SMALL DOT | T1 | L | L | | | | | | |
| | | T2 | L | H | | | | | | |
| | NON-RECORDING | T1 | L | H | | | | | | |
| | | T2 | L | L | | | | | | |
| SECOND SYSTEM | LARGE DOT | T1 | | | H | L | | | | |
| | | T2 | | | H | L | | | | |
| | MEDIUM DOT | T1 | | | H | L | | | | |
| | | T2 | | | L | H | | | | |
| | SMALL DOT | T1 | | | L | L | | | | |
| | | T2 | | | L | H | | | | |
| | NON-RECORDING | T1 | | | L | H | | | | |
| | | T2 | | | L | L | | | | |
| THIRD SYSTEM | LARGE DOT | T1 | | | | | H | L | | |
| | | T2 | | | | | H | L | | |
| | MEDIUM DOT | T1 | | | | | H | L | | |
| | | T2 | | | | | L | H | | |
| | SMALL DOT | T1 | | | | | L | L | | |
| | | T2 | | | | | L | H | | |
| | NON-RECORDING | T1 | | | | | L | H | | |
| | | T2 | | | | | L | L | | |
| FOURTH SYSTEM | LARGE DOT | T1 | | | | | | | H | L |
| | | T2 | | | | | | | H | L |
| | MEDIUM DOT | T1 | | | | | | | H | L |
| | | T2 | | | | | | | L | H |
| | SMALL DOT | T1 | | | | | | | L | L |
| | | T2 | | | | | | | L | H |
| | NON-RECORDING | T1 | | | | | | | L | H |
| | | T2 | | | | | | | L | L |

*BLANK CELLS REPRESENT L

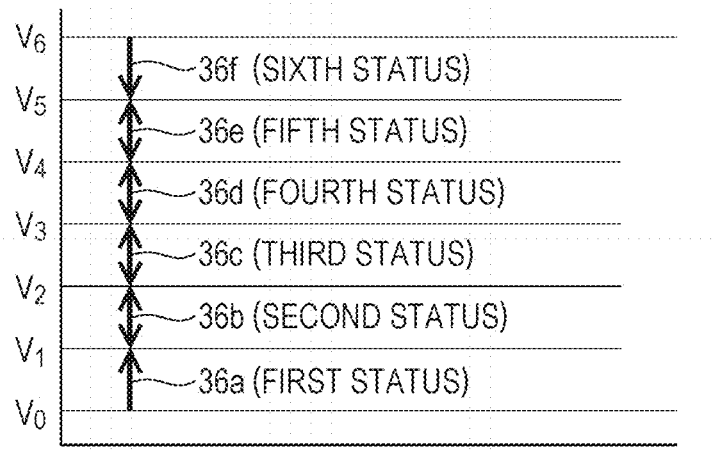

<FIRST STATUS: CHARGE>

<SECOND STATUS: CHARGE>

<SECOND STATUS: DISCHARGE>

<FIRST STATUS: DISCHARGE>

<STATUS A (SELECTION OF TERMINAL a)>

<STATUS B (SELECTION OF TERMINAL b)>

<PRESENT EMBODIMENT>

<COMPARATIVE EXAMPLE>

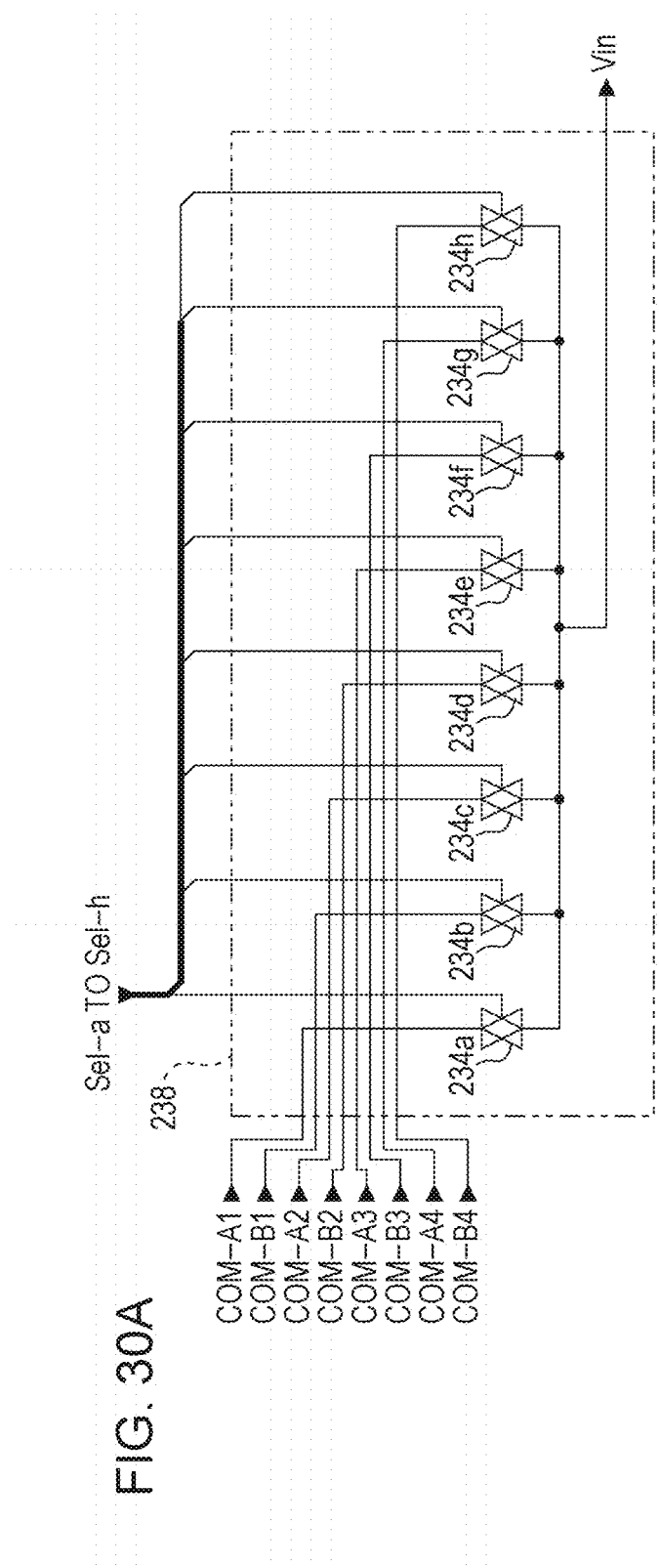
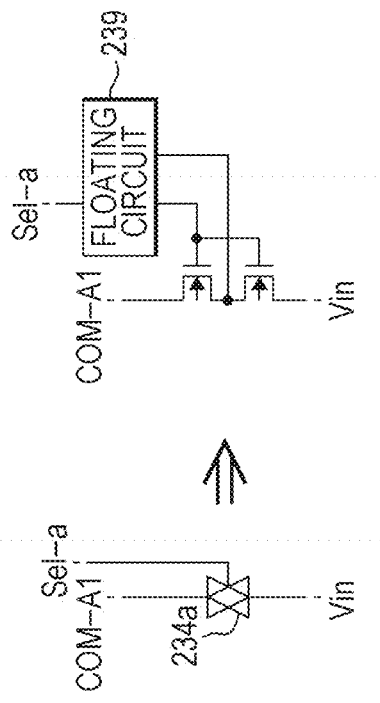
FIG. 30A
FIG. 30B

LIQUID DISCHARGE APPARATUS, HEAD UNIT, AND CONTROL METHOD OF LIQUID DISCHARGE APPARATUS

The entire disclosure of Japanese Patent Application No. 2014-005663, filed Jan. 16, 2014 is expressly incorporated by reference herein.

BACKGROUND

1. Technical Field

The present invention relates to a liquid discharge apparatus, a head unit, and a control method of the liquid discharge apparatus.

2. Related Art

As an ink jet printer that discharges ink and prints an image or a document, a printer that uses piezoelectric elements (for example, piezo element) is known. The piezoelectric elements are provided respectively corresponding to a plurality of nozzles in a head unit (print head) and are respectively driven in accordance with drive signals and thereby a predetermined amount of ink (liquid) is discharged from the nozzles at a predetermined timing. The piezoelectric element is a capacitive load like a capacitor in terms of electric power and a sufficient current is needed to operate the piezoelectric element of the nozzle.

Therefore, in the related art, a configuration is known, in which the drive signal is amplified by using an amplifier circuit and the amplified drive signal is supplied to the head unit such that the piezoelectric element is driven.

In a case where gradation is expressed in such a configuration, a configuration is also known in which two types or more of drive signals are prepared and the amplified two types or more of drive signals are combined according to the gradation and supplied to the piezoelectric element. For example, when A waveform and B waveform, each of which has a first half pattern and a second half pattern as a drive signal are prepared, four types of (A-A), (A-B), (B-A), and (B-B) are formed as the combinations (first half-second half). When a combination is selected in accordance with the gradation from the four types and supplied to the piezoelectric element, an amount of ink in accordance with the gradation is discharged such that it is possible to express the gradation.

As a switch that selects a combination in accordance with the gradation from A waveform and B waveform, a transfer gate is often used. The transfer gate is not formed to have a simple configuration in which a P type and an N type are combined. This is because a voltage range of the amplified drive signal, that is, a drive voltage range of the piezoelectric element, reaches a range of 0 volts to 42 volts. Therefore, a transfer gate is proposed, in which a so-called floating gate is employed and, while a small potential difference between a gate and a source with respect to a change of an input/output voltage is maintained, switching is performed (see JP-A-2004-363997).

However, the transfer gate described above has a complex configuration and power consumption thereof is great. When the configuration of selecting from A waveform and B waveform is provided, two sets of transfer gates are sufficient as a switch, but in a case where a pseudo-resolution becomes high or the like, three sets or more of transfer gates are needed, and thus a complex configuration and high power consumption are problems to be solved.

SUMMARY

An advantage of some aspects of the invention is to provide a liquid discharge apparatus which has a particularly simple configuration of a switch (selection section) which selects a waveform and suppresses power consumption of the selection section, a head unit, and a control method of the liquid discharge apparatus.

In order to achieve the advantage described above, a liquid discharge apparatus according to an aspect of the invention includes: an original drive signal generator that generates a plurality of original drive signals which includes a first original drive signal and a second original drive signal; a selection section that is capable of selecting one original drive signal from the plurality of original drive signals which includes the first original drive signal and the second original drive signal; a driver that generates a drive signal of voltages in accordance with the one original drive signal; a piezoelectric element that is displaced according to the drive signal; a cavity of which an inside volume is changed due to the displacement of the piezoelectric element; and a nozzle that is provided to discharge a liquid in the cavity according to the change of the inside volume of the cavity.

In the liquid discharge apparatus according to the aspect, the selection section that selects any one of the plurality of original drive signals which includes the first original drive signal and the second original drive signal is positioned on the upstream side of the driver that generates the drive signal of the voltage in accordance with the original drive signal. Therefore, a wide voltage range is not required for input/output characteristics of elements (for example, transfer gate) which configure the selection section, and thus it is possible to achieve a simple configuration or low power consumption.

According to the aspect, the liquid discharge apparatus may further include: a charge source that supplies a charge; a first signal path to which a first voltage is applied by the charge source; and a second signal path to which a second voltage that is higher than the first voltage is applied by the charge source. The driver may cause the piezoelectric element and the charge source to be electrically connected to each other through at least one of the first signal path or the second signal path according to the voltage in accordance with the one original drive signal and a hold voltage of the piezoelectric element.

In this configuration, the driver causes the piezoelectric element and the charge source to be electrically connected to each other through at least one of the first signal path and the second signal path, and thereby the piezoelectric element is charged and discharged. Since the charge is performed in a stepwise manner in order of the first voltage and the second voltage and the discharge is performed in order of the second voltage and the first voltage, it is possible to achieve high energy efficiency compared to a configuration in the related art in which the charge or the discharge between power supply voltages is performed at once. In addition, the driver executes the charge and discharge of the piezoelectric element by electrically connecting the piezoelectric element and the charge source through the first signal path or the second signal path. Therefore, voltage amplitude of the original drive signal input by the driver may be low and input impedance may be high.

According to the aspect or configuration, the original drive signal generator may include a delay unit that outputs a third original drive signal which is generated by delaying the first original drive signal and outputs a fourth original drive signal which is generated by delaying the second original drive signal. The selection section may be capable of selecting any one of the plurality of original drive signals which includes the first original drive signal, the second original drive signal, the third original drive signal, and the fourth original drive signal.

The third original drive signal is output by delaying the first original drive signal, the fourth original drive signal is output by delaying the second original drive signal, and the selection section selects any one of the plurality of original drive signals which includes the first original drive signal, the second original drive signal, the third original drive signal, and the fourth original drive signal. Therefore, it is possible to obtain diverse original drive signals that are used for driving.

Here, in a configuration including the delay unit, the original drive signal that is selected by the selection section may be an analog signal or a digital signal.

To be more specific, in the configuration including the delay unit, the selection section may input, as analog signals, the plurality of original drive signals which includes the first original drive signal, the second original drive signal, the third original drive signal, and the fourth original drive signal so as to be capable of selecting any one of the original drive signals.

In addition, in the configuration including the delay unit, the liquid discharge apparatus may further include a D/A converter that corresponds to the selection section. The selection section may be provided to input, as digital signals, the plurality of original drive signals which includes the first original drive signal, the second original drive signal, the third original drive signal, and the fourth original drive signal so as to be capable of selecting any one of the original drive signals. The D/A converter may convert the one original drive signal into an analog signal and supply the converted analog signal to the driver. In a case where the selection section selects an original drive signal of the digital signal, it is possible to configure the selection section to be a simple data selector.

The invention can be realized in various aspects such as a control method of the liquid discharge apparatus or a single head unit.

BRIEF DESCRIPTION OF THE DRAWINGS

The invention will be described with reference to the accompanying drawings, wherein like numbers reference like elements.

FIG. 7 is a diagram illustrating a configuration of a selection controller in the head unit.

FIG. 8 is a table illustrating decoded details of a decoder in the head unit.

FIG. 15 is a diagram illustrating an operational range of each level shifter in the driver.

FIGS. 30A and 30B are diagrams illustrating a configuration of a selection section according to Comparative Example (2).

DESCRIPTION OF EXEMPLARY EMBODIMENTS

Hereinafter, embodiments according to the invention will be described with reference to the drawings.

Entire Configuration of Printing Apparatus

A printing apparatus according to the embodiment is an ink jet printer, that is, a liquid discharge apparatus, which discharges ink according to image data supplied from a host computer such that an ink dot group is formed on a printing medium such as paper, and thereby prints an image (including a text, a figure, or the like) in accordance with the image data.

Figure 1:
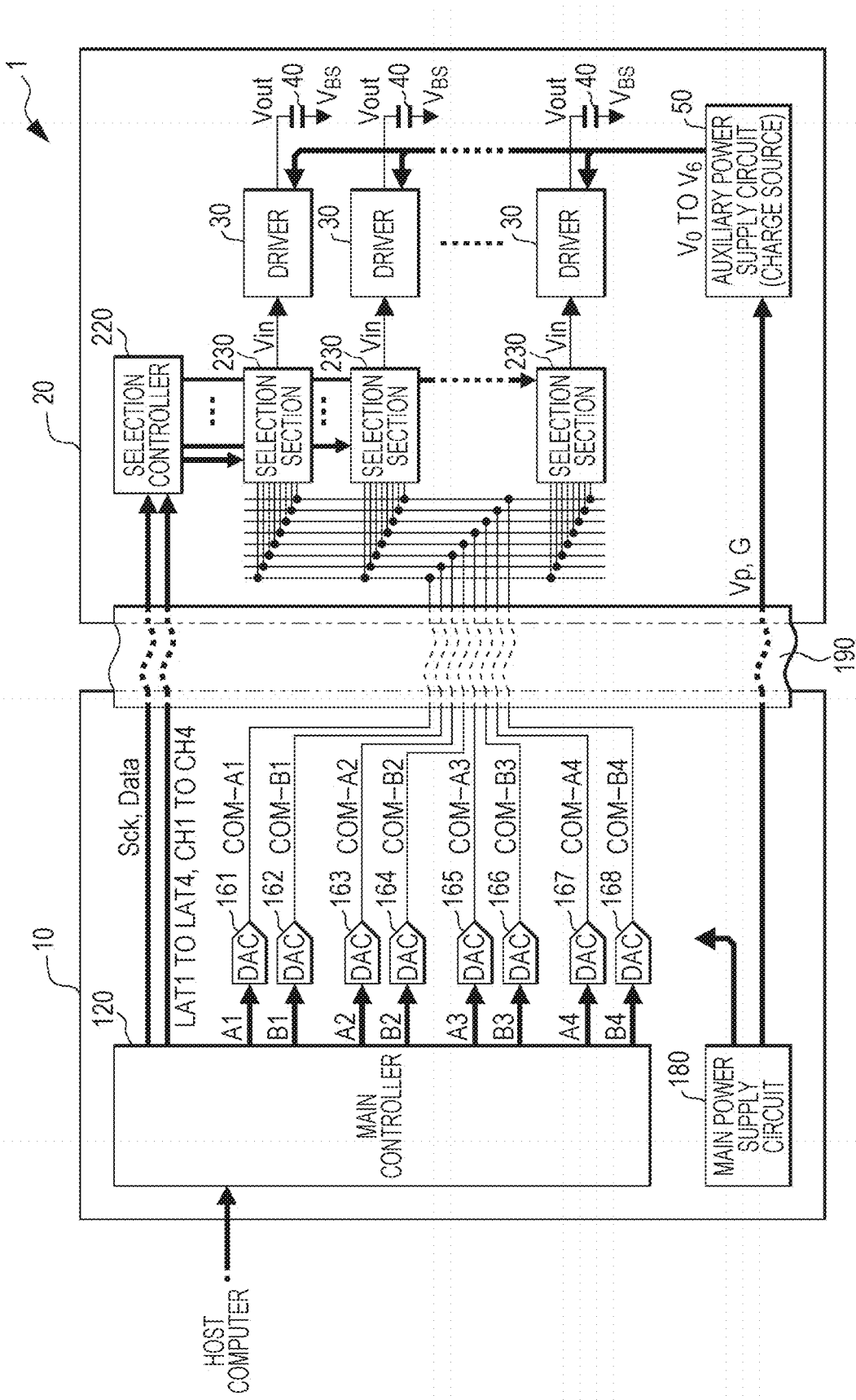
FIG. 1 is a diagram schematically illustrating a configuration of a control unit and a head unit of a printing apparatus.

FIG. 1 is a diagram schematically illustrating a configuration of a printing apparatus 1.

As illustrated in FIG. 1, the printing apparatus 1 is configured to have a control unit 10 that executes a computing process for printing an image on the basis of the image data supplied from the host computer and a head unit 20 that has a plurality of nozzles. The control unit 10 and the head unit 20 are electrically connected through a flexible cable 190. In addition, the head unit 20 is mounted on a carriage (not illustrated) which is movable in a direction (main scanning direction) substantially orthogonal to a feed direction (sub scanning direction) of the print medium.

The control unit 10 includes a main controller 120, digital to analog converters (DAC) 161 to 168, and a main power supply circuit 180.

The main controller 120 executes a computing process for printing such as an image display process, color conversion process, ink color separating process, or a halftone process on the basis of the image data acquired from the host computer and generates a plurality of types of signals for causing the ink to be discharged from a nozzle of the head unit 20. The plurality of types of signals include digital data A1 to A4 and B1 to B4, or various signals to be supplied to a selection controller 220, to be more specific, a clock signal Sck, a data signal Data, and control signals LAT1 to LAT4 and CH1 to CH4.

Each computing process for printing which is executed by the main controller 120 may be executed by the host computer in some cases. The details of the computing process are so well known in the technical field of the printing apparatus that a description thereof is omitted.

In addition, as for the printing apparatus 1, a carriage motor to move a carriage mounted on the head unit in the main scanning direction, a transport motor for transporting the printing medium in the sub scanning direction, and the like are included, and as for the control unit 10, a configuration of supplying drive signals to these motors is included, but similarly, these are so well known that a description thereof is omitted.

The DAC 161 converts the digital data A1 into an analog original drive signal COM-A1 and supplies the converted signal to the head unit 20. Similarly, the DACs 162 to 168 convert the digital data B1, A2, B2, A3, B3, A4, and B4 into analog original drive signals COM-B1, COM-A2, COM-B2, COM-A3, COM-B3, COM-A4, and COM-B4 and supply the head unit 20 with the converted signals.

Voltage ranges of the original drive signals COM-A1 to COM-A4 and COM-B1 to COM-B4 are, for example, 0 volts to 4.2 volts according to the present embodiment. In addition, the original drive signal COM-A1 is an example of a first original drive signal and the original drive signal COM-B1 is an example of a second original drive signal.

The main power supply circuit 180 supplies a power supply voltage to each component of the control unit 10 or to the head unit 20 and particularly supplies Vp and G as the power supply voltage to the head unit 20.

G (ground) is ground potential, and is a reference of a zero voltage, as long as there is no specific description. In addition, the voltage Vp is on a higher side than the ground G according to the embodiment.

Ink is supplied to the head unit 20 from an ink container through a flow path, which is not illustrated specifically. The head unit 20 includes a plurality of sets of drivers 30 and piezoelectric elements (piezo element) 40, in addition to an auxiliary power supply circuit (charge source) 50, the selection controller 220, and the selection section 230.

The auxiliary power supply circuit 50 generates voltages $V_0$ to $V_6$ by using the power supply voltages Vp and G by the main power supply circuit 180 and supplies the voltages to the plurality of drivers 30, in common. A configuration of the auxiliary power supply circuit 50 will be described in detail.

The selection controller 220 controls selection of the selection section 230 in accordance with various signals supplied from the main controller 120.

The selection sections 230 are provided respectively corresponding to the plurality of sets of drivers 30 and piezoelectric elements 40, select any one of the original drive signals COM-A1 to COM-A4 and COM-B1 to COM-B4 in accordance with the control by the selection controller 220, and supply the selected signal as an original drive signal (one selected) Vin to an input end of the driver 30.

The driver 30 outputs a drive signal of a voltage Vout in accordance with the original drive signal Vin which is supplied from the selection section 230 by using the voltages $V_0$ to $V_6$ which are supplied from the auxiliary power supply circuit 50 and drives the piezoelectric element 40.

One end of the piezoelectric element 40 is connected to an output end of the corresponding driver 30 and the other end of the piezoelectric element 40 is connected in common to a feed wire in which a voltage $V_{BS}$ is maintained. Therefore, the voltage held in the piezoelectric element 40 is a difference between the voltage Vout and the voltage $V_{BS}$.

As described above, the piezoelectric element 40 is provided to correspond to each of the plurality of nozzles in the head unit 20 and causes the ink to be discharged by the driving in accordance with the voltage Vout of the drive signal by the driver 30. Next, a configuration for discharging the ink by driving the piezoelectric element 40 will be described concisely.

Figure 2:
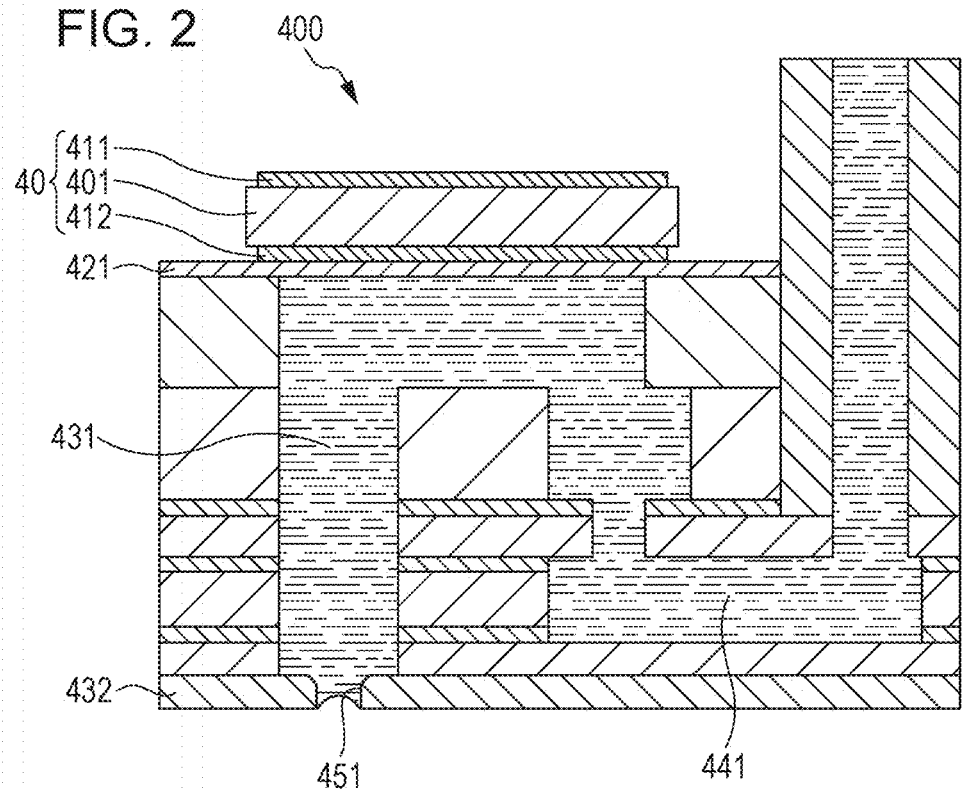
FIG. 2 is a view illustrating a configuration of a discharge section in the head unit.

FIG. 2 is a view schematically illustrating a configuration of a discharge section 400 corresponding to one nozzle in the head unit 20.

As illustrated in FIG. 2, the discharge section 400 includes the piezoelectric element 40, a vibration plate 421, a cavity (pressure chamber) 431, a reservoir 441, and a nozzle 451. The vibration plate 421 is deformed (flexurally vibrated) by the piezoelectric element 40 provided on the top surface in FIG. 2 and functions as a diaphragm that causes an inside volume of the cavity 431 which is filled with the ink to expand/contract. The nozzle 451 is provided in a nozzle plate 432 and is an opening through which communication to the cavity 431 is performed.

The piezoelectric element 40 illustrated in FIG. 2 is called a unimorph (monomorph) type in general and has a configuration in which a piezoelectric body 401 is interposed between a pair of electrodes 411 and 412. The central portion of the piezoelectric body 401 with the configuration is bent in the vertical direction with respect to both end portions in FIG. 2 according to the voltage applied between the electrodes 411 and 412 along with the electrodes 411 and 412 and the vibration plate 421. Specifically, the piezoelectric element 40 is configured to be bent upward when the voltage Vout of the drive signal is high and to be bent downward when the voltage Vout is low. In this configuration, the upward bending causes the inside volume of the cavity 431 to expand, and thus the ink is caused to be gathered from the reservoir 441 and the downward bending causes the inside volume of the cavity 431 to contract, and thus the ink is caused to be discharged from the nozzle 451 by a degree of the contraction.

The piezoelectric element 40 is not limited to the unimorph type, but may be a type such as a bimorph type or a stacked type, as long as the piezoelectric element 40 is caused to deform such that a liquid such as ink can be discharged. In addition, the piezoelectric element 40 is not limited to a configuration of the flexural vibration, but may have a configuration of longitudinal vibration.

Figure 3:
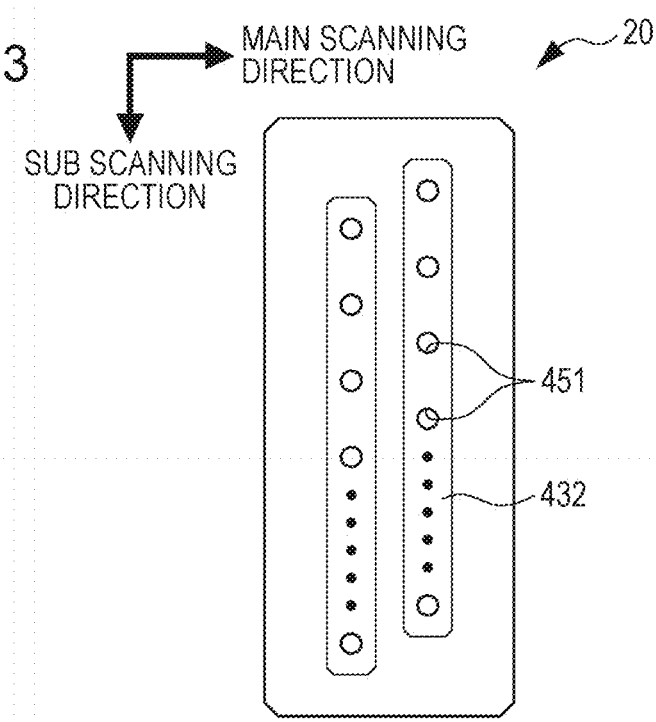
FIG. 3 is a view illustrating a nozzle array in the head unit.

FIG. 3 is a view illustrating an example of an array of the nozzles 451. In addition, FIG. 4A is a partially enlarged view of FIG. 3 (FIG. 5A and FIG. 6A are the same). These drawings illustrate an array of the nozzles 451 when the printing medium is positioned on the rear side of the paper surface.

As illustrated in these drawings, the nozzles 451 are arranged in two rows. To be more specific, regarding one row, the plurality of nozzles 451 are disposed at a pitch Pv along the sub scanning direction, and the two rows are separated from each other at a pitch Ph in the main scanning direction and have a relationship in which the nozzles 451 in one row are shifted by half the pitch Pv in the sub scanning direction.

In a case of color printing, the nozzles 451 have a pattern to be provided corresponding to each color such as cyan (C), magenta (M), yellow (Y), and black (K) along the main scanning direction, but here, performance of single color printing is described for the sake of simplification.

The number of the nozzles 451 (piezoelectric elements 40) is determined to be m for the sake of the convenience of the description. In addition, in order to distinguish each nozzle 451, circled numbers of odd numbers of 1, 3, 5, . . . , are given to the nozzles in a row on the downstream side in the main scanning direction in FIG. 4A (right side in FIG. 4A) in order from the upstream side in the sub scanning direction (upper side in FIG. 4A) toward the downstream side, and circled numbers of even numbers of 2, 4, 6, . . . , are given to the nozzles in a row on the upstream side in the main scanning direction (left side in FIG. 4A) in order from the upstream side in the sub scanning direction.

Figure 4B:
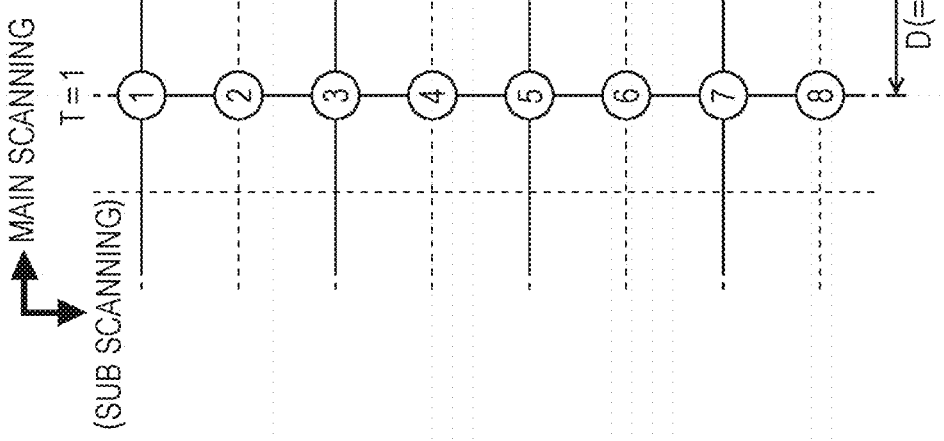
FIGS. 4A and 4B are views illustrating a relationship between the nozzle array and dots formed by discharging ink droplets.
Figure 4A:
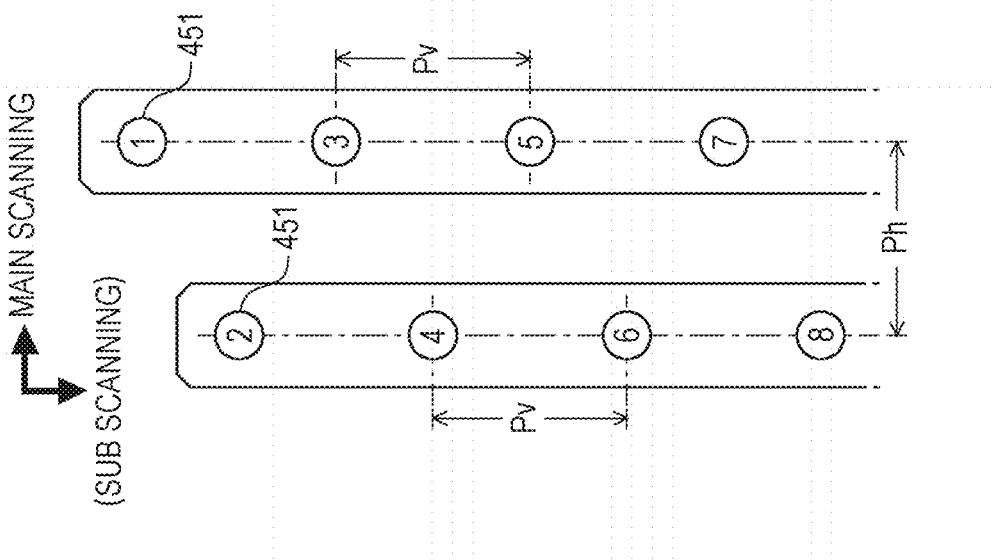

FIG. 4B is a view illustrating a basic resolution of image formation by the nozzle array illustrated in FIG. 4A.

To be more specific, FIG. 4B illustrates dots formed by landing of ink droplets which are discharged from the nozzles 451 to which circled numbers are given. According to the present embodiment, it is possible to express four gradations of large dots, medium dots, small dots, and non-recording according to an amount of ink droplets as will be described later, but here, the size of the dot is determined to be the same for the sake of the simple description.

As illustrated in FIG. 4B, when the head unit 20 moves in the main scanning direction at a velocity v, a distance D (in the main scanning direction) between the dots formed by landing of the ink droplets and the velocity v have a relationship as follows.

That is, the dot distance D is represented by a value (=v/f) obtained by dividing the velocity v by a frequency f of the drive signal of the piezoelectric element 40, that is, a moving distance of the head unit 20 in a cycle (1/f) in which the ink droplets are discharged repeatedly. In addition, in order for the ink droplets which are discharged from the two rows of the nozzles 451 to land on the printing medium such that the ink droplets are aligned in the same row in this example, the pitch Ph and the dot distance D have a relationship which is proportional by a coefficient n.

Here, in a case where the drive signal of the piezoelectric element 40 has a constant frequency and the velocity v is lowered, the distance D between the dots becomes short, and thus it is possible to achieve a high resolution. However, printing takes a long time and thus the productivity of the printing medium is lowered.

In the first place, the array of the dots illustrated in FIG. 4B is an example of a case in which the piezoelectric elements 40 of the nozzles 451 are controlled at the same timing. Here, it is examined that the piezoelectric elements 40 are controlled at a different driving timing from each other to achieve a high resolution artificially without lowering the velocity v.

Figure 5B:
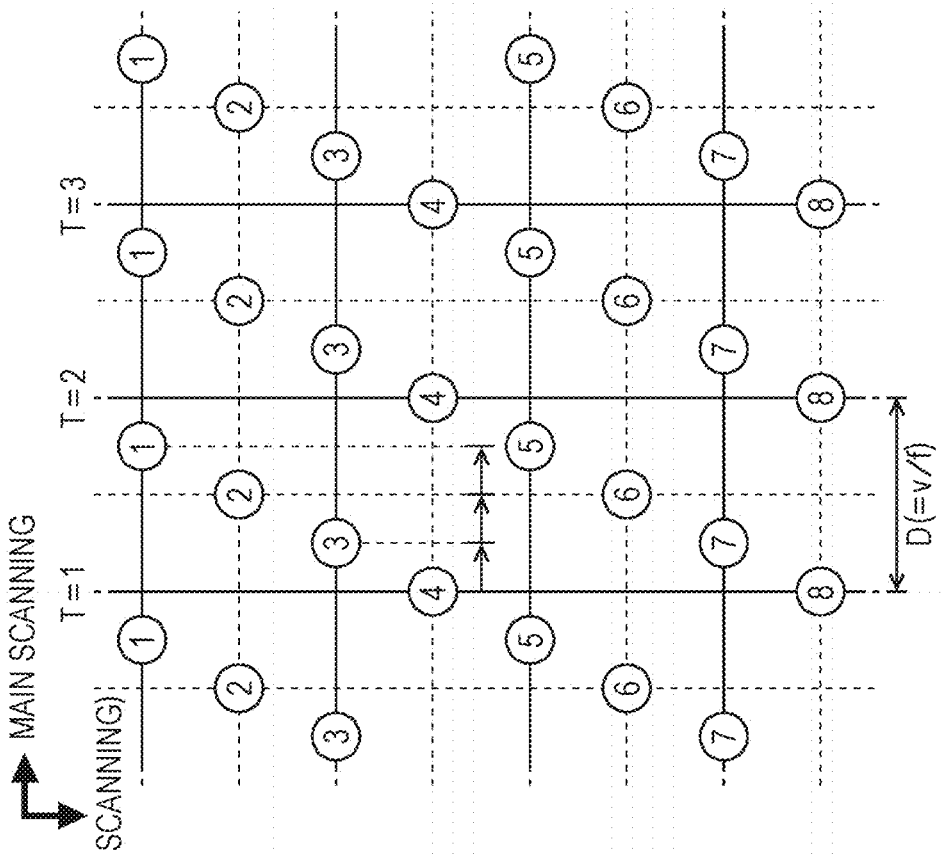
FIGS. 5A and 5B are views illustrating a relationship between the nozzle array and dots formed by discharging ink droplets.
Figure 5A:
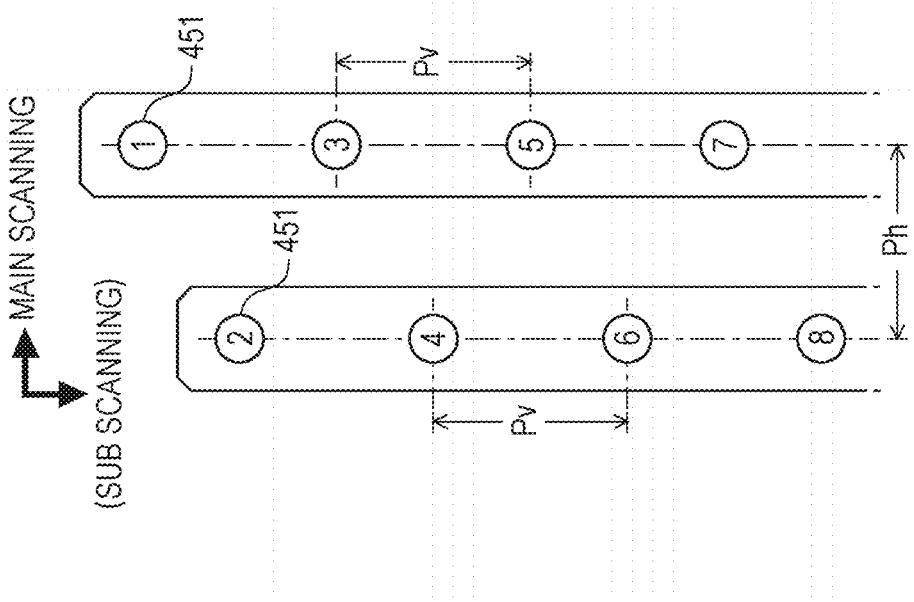

FIG. 5B is an example of a case in which the piezoelectric elements 40 of the nozzles 451 are controlled by using four timing systems. In this example, in a case of driving, by using a reference drive signal, the piezoelectric elements 40 of the nozzles 451 that are given the circled numbers of 4, 8, . . . , of which remainders are "0" when divided by 4, the piezoelectric elements 40 of the other nozzles 451 are driven at a timing delayed by 90 degrees (π/2) in a phase. To be more specific, an example is represented, in which the piezoelectric elements 40 of the nozzles 451 that are given the circled numbers of 3, 7, . . . , of which remainders are when divided by 4 are driven at a timing delayed by 90 degrees in a phase of the drive signal, the piezoelectric elements 40 of the nozzles 451 that are given the circled numbers of 2, 6, . . . , of which remainders are "2" when divided by 4 are driven at a timing delayed by 180 degrees in a phase of the drive signal, and the piezoelectric elements 40 of the nozzles 451 that are given the circled numbers of 1, 5, . . . , of which remainders are "1" when divided by 4 are driven at a timing delayed by 270 degrees in a phase of the drive signal.

In this example, the resolution in the main scanning direction becomes four times as high as that in FIG. 4B.

However, in this example, since the driving timing of the piezoelectric elements of the nozzles 451 is fixed, it is not possible to reproduce a smooth curve or a position of a line with high accuracy. Then, in order to improve this aspect, an example of a case of controlling the piezoelectric elements 40 of the nozzles 451 by using any one of the plurality of timing systems and increasing the flexibility of dots to be formed is described.

Figure 6B:
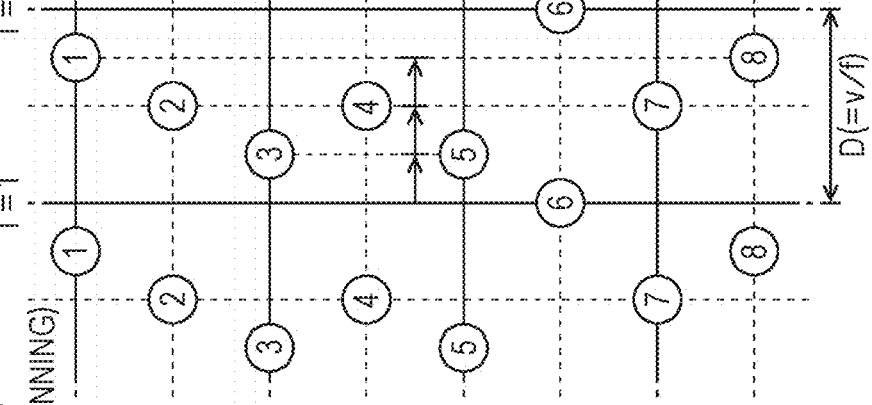
FIGS. 6A and 6B are views illustrating a relationship between the nozzle array and dots formed by discharging ink droplets.
Figure 6A:
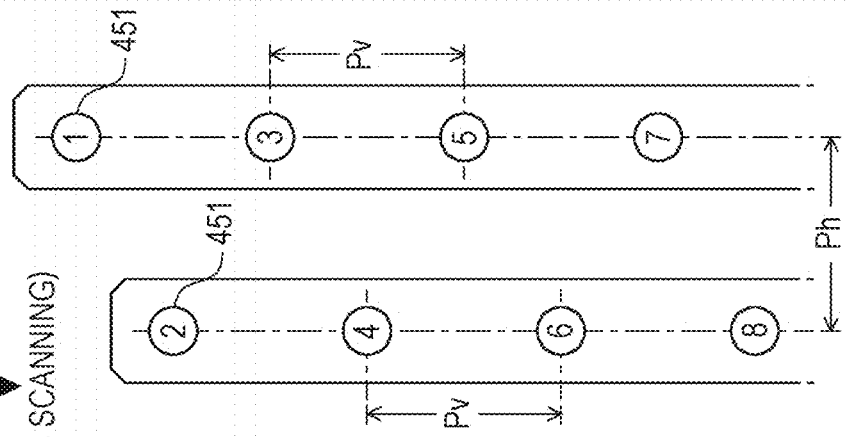

FIG. 6B illustrates an example of a case of controlling the piezoelectric elements 40 of the nozzles 451 by using any one of four timing systems.

For example, in FIG. 6B, the piezoelectric elements 40 of the nozzles 451 with the circled numbers of 4, 8, . . . , are driven at different timings from each other. In addition, the piezoelectric elements 40 of the nozzles 451 with the circled numbers of 2, 6, . . . , are driven at different timings from each other. In such driving, the driving timing of the piezoelectric element of each nozzle 451 is selected to be any one of the four systems according to the curve or a position of a line, and thereby it is possible to depict the smooth curve and the position of the line with high accuracy.

Understandably, when the number of driving timing systems is increased, much higher-resolution printing can be performed, but hereinafter, an example of a case where the number of systems is "4" is described.

In a case where the piezoelectric element 40 of each nozzle 451 is controlled by using any one of the four timing systems, there are restrictions as follows.

(1) When viewed from a certain nozzle 451, ink droplets are not discharged to have less than the dot distance D when the head unit 20 moves in the main scanning direction at the velocity v. In other words, the piezoelectric element 40 of the nozzle 451 is not driven at an interval less than a cycle of the drive signal.

(2) When a certain nozzle is focused on, the drive timing of the nozzle seems to be fixed by using any one of the drive timing systems. For example, a nozzle 451 of the circled number of 6 in FIG. 6B is driven by the reference drive signal and a nozzle 451 of the circled number of 5 is driven by a drive signal of which the phase is delayed by 90 degrees with respect to the reference drive signal. However, in the restriction (2), a drive timing of a certain nozzle is avoidable by using a configuration in which a certain system is switched to another system during the printing.

The original drive signals COM-A1 to COM-A4 (COM-B1 to COM-B4), LAT1 to LAT4, and CH1 to CH4 correspond to systems, respectively. Here, in order to distinguish the systems, the systems defined as the original drive signals COM-A1 (COM-B1), LAT1, and CH1 are described as a "first system" and similarly, the systems defined as the original drive signals COM-A2 to COM-A4 (COM-B2 to COM-B4), LAT2 to LAT4, and CH2 to CH4 are described as a "second system", a "third system", and a "fourth system", respectively.

FIG. 7 is a diagram illustrating a configuration of the selection controller 220 in FIG. 1.

As illustrated in FIG. 7, the clock signal Sck, the data signal Data, the control signals LAT1 to LAT4 and CH1 to CH4 are supplied to the selection controller 220 from the control unit 10. The selection controller 220 includes a set of a shifter register (S/R) 222 and a latch circuit 224, and a decoder 226 corresponding to each of the piezoelectric elements 40 (nozzles 451).

Here, when one dot of an image is formed by the data signal Data, the signal includes data that regulates which system should be used to drive one nozzle to form the one dot, among the four systems, in addition to regulating an amount of ink to be discharged from one nozzle. According to the present embodiment, since four gradations of non-recording, a small dot, a medium dot, and a large dot are expressed, the data that regulates the amount of ink is 2-bit data and since the number of systems is "4", the data that regulates the drive system is also 2-bit data. The data signal Data is synchronized with the clock signal Sck and is supplied serially to each of the piezoelectric elements 40 (nozzle) from the main controller 120 along with main scanning of the head unit 20.

The shifter register 222 includes a circuit for temporarily holding the supplied data signal Data corresponding to the nozzle. To be more specific, m stages of shifter registers 222 corresponding to the number of piezoelectric elements 40 (nozzles) form a cascade connection to each other and the serially supplied data signal Data is transferred to a subsequent stage sequentially in accordance with the clock signal Sck.

Therefore, When the data signals Data are synchronized with the clock signal Sck and are supplied to the selection controller 220 and supply of the clock signal Sck is stopped at the time when the data signals Data corresponding to all of the shifter registers 222 are sequentially transferred, each of the shifter registers 222 holds the data signal Data corresponding to each shifter register 222.

In a case where there are m piezoelectric elements 40, in order to distinguish the shifter registers 222, the shifter registers 222 are described as a first stage, a second stage, and an m-th stage sequentially from the upstream side from which the data signal Data is supplied.

The latch circuit 224 latches the data signal Data held in the shifter register 222 at a rise in a control signal of a system which is regulated by the data signal Data between the control signals LAT1 to LAT4. For example, in a case where the data signal Data held in the shifter register 222 regulates the drive by the second system, the latch circuit 224 latches the data signal Data at a rise of the control signal LAT2.

The decoder 226 holds and decodes the data signal Data latched by the latch circuit 224, and outputs selection signals Sel-a to Sel-h for each of periods T1 and T2 of the system which is regulated by the data signal Data. Decoded details in the decoder 226 are illustrated in FIG. 8 which will be described later.

Figure 9A:
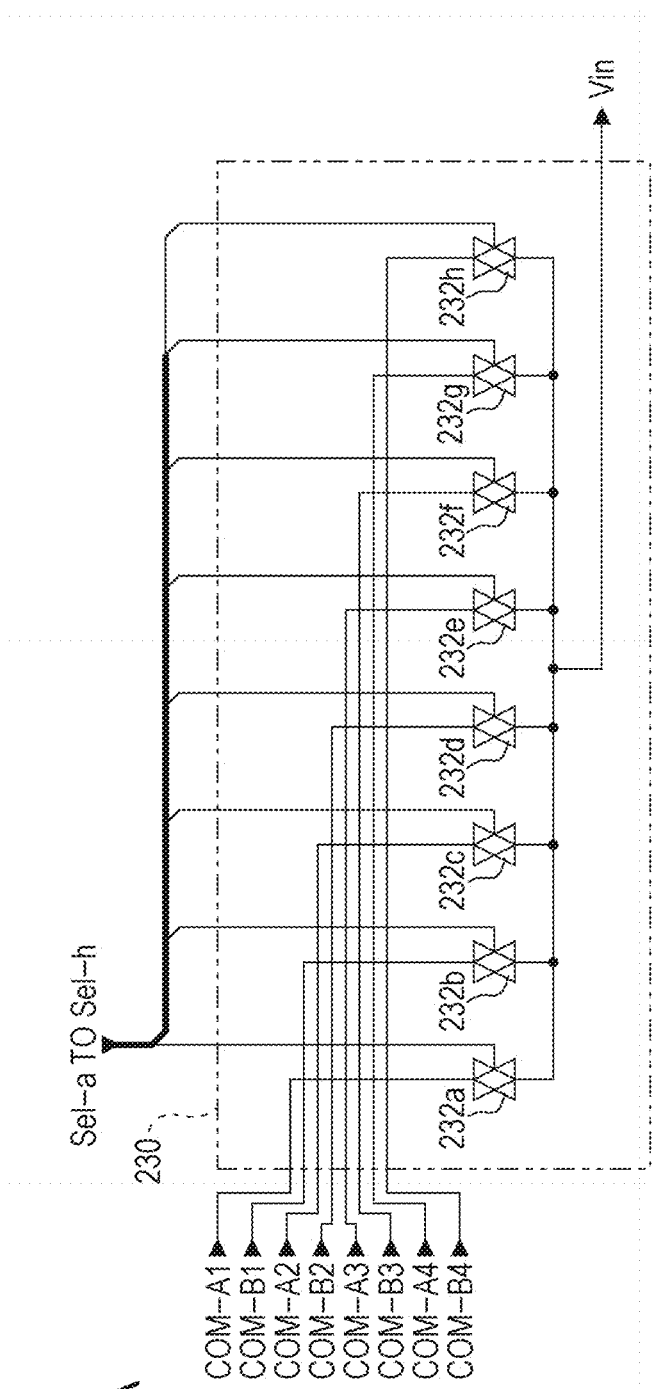
FIGS. 9A and 9B are diagrams illustrating a configuration of the selection section in the head unit.
Figure 9B:
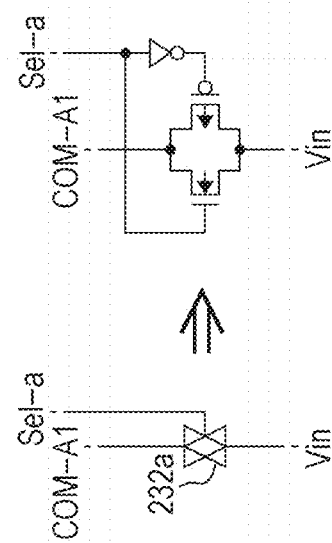

FIGS. 9A and 9B are diagrams illustrating a configuration of the selection section 230 in FIG. 1.

As illustrated in FIG. 9A, the selection section 230 includes 8 transfer gates 232a to 232h. The original drive signal COM-A1 is supplied to an input end of the transfer gate 232a, and similarly, the original drive signals "−" (when describing after the hyphen, B1, A2, B2, A3, B3, A4, and B4) are supplied to input ends of the transfer gates 232b to 232h.

When the selection signal Sel-a output from the decoder 226 has an H level, the transfer gate 232a causes the input end and the output end to be conductive (on) to each other, and when the selection signal Sel-a has an L level, the transfer gate 232a causes the input end and the output end to be non-conductive (off) from each other. Similarly, the transfer gates 232b to 232h cause the input ends and the output ends to be on to or off from each other according to the respective selection signals Sel-b to Sel-h.

The output ends of the transfer gates 232a to 232h are commonly connected to each other and become an input end of the driver 30.

The voltage ranges of the original drive signals COM-A1 to COM-A4 and COM-B1 to COM-B4 are 0 volts to 4.2 volts as described above. Therefore, as illustrated in FIG. 9B, it is possible to configure the transfer gate 232a in which the input is the original drive signal COM-A1 to have a transistor in which a P type and an N type are combined complementarily and an inverter (NOT circuit). The transfer gates 232b to 232h have the same configuration.

Before the operations of the selection controller 220 and the selection section 230 which have such configurations are described, waveforms of the original drive signals COM-A1 to COM-A4 and COM-B1 to COM-B4 are described.

Figure 10:
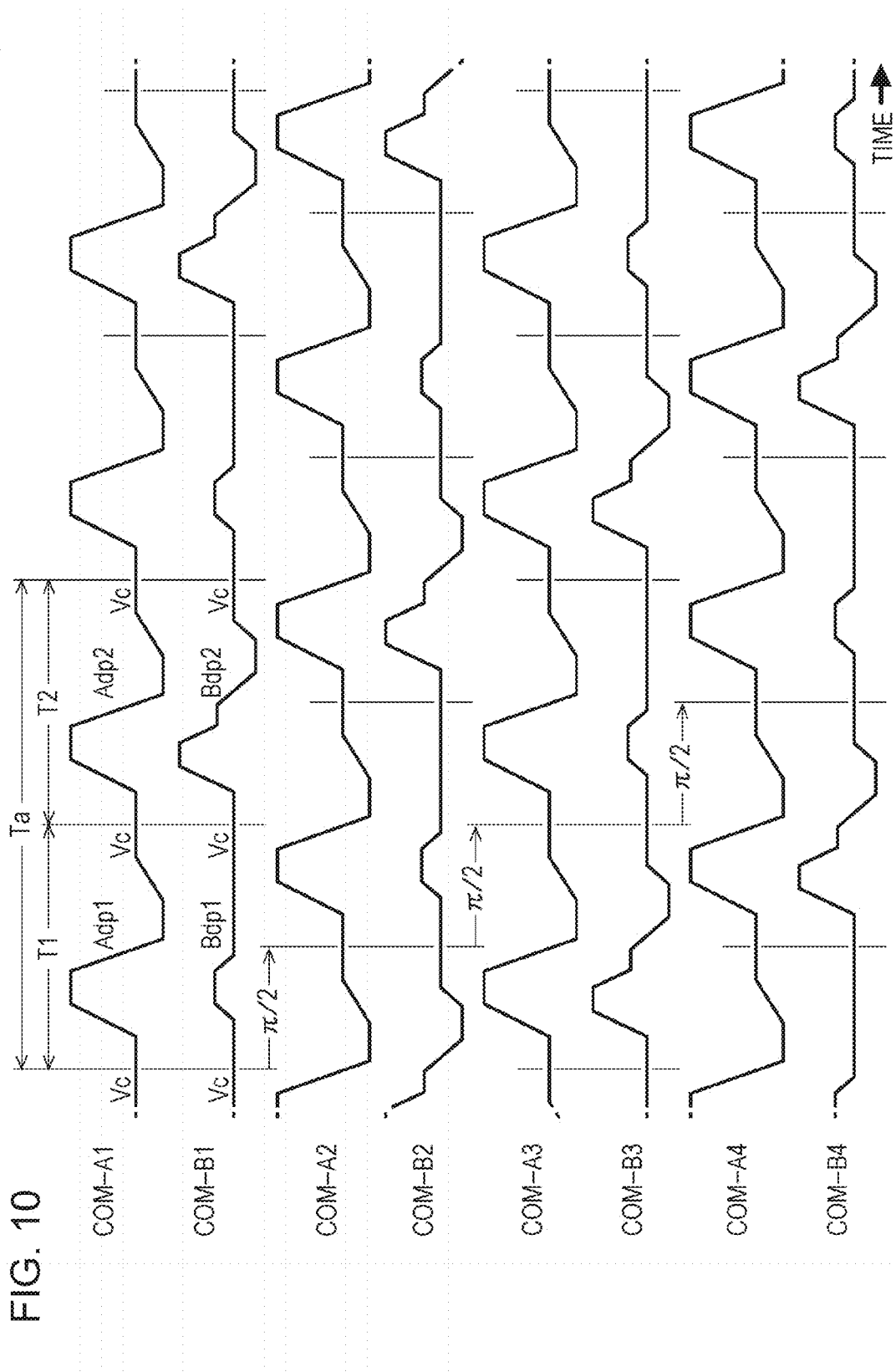
FIG. 10 is a diagram illustrating an example of an original drive signal COM or the like that is supplied to the head unit.

FIG. 10 is a diagram illustrating the waveforms of the original drive signals COM-A1 to COM-A4 and COM-B1 to COM-B4.

The original drive signals COM-A2 and COM-B2 corresponding to the second system are delayed by 90 degrees in the phase with respect to the original drive signals COM-A1 and COM-B1 corresponding to the first system. That is, an amount of delayed phase of the second system with respect to the first system becomes $\pi/2$. Similarly, the original drive signals COM-A3 and COM-B3 corresponding to the third system are delayed by 90 degrees in the phase with respect to the second system, and further, the original drive signals COM-A4 and COM-B4 corresponding to the fourth system are delayed by 90 degrees in the phase with respect to the third system.

When the first system is described to be representative of the first system to fourth system, the original drive signal COM-A1 forms a waveform of repeating a trapezoidal waveform Adp1 in a first half period T1 of a cycle Ta and a trapezoidal waveform Adp2 in a second half period T2. The trapezoidal waveforms Adp1 and Adp2 are substantially the same waveform according to the present embodiment. When each of the waveforms is supplied to the driver 30 and it is assumed that the piezoelectric element is driven, the waveforms cause a predetermined amount, that is, specifically, a substantially medium amount of ink to be discharged from the nozzle 451.

The original drive signal COM-B1 forms a waveform of continuing a trapezoidal waveform Bdp1 in the first half period T1 and a trapezoidal waveform Bdp2 in the second half period T2. The trapezoidal waveforms Bdp1 and Bdp2 are different waveforms from each other according to the present embodiment. The trapezoidal waveform Bdp1 is a waveform for causing the ink in the vicinity of the opening of the nozzle 451 to vibrate minutely so as to prevent the viscosity of the ink from increasing. Therefore, even when the trapezoidal waveform Bdp1 is supplied to the driver 30 and the piezoelectric element 40 is driven, the ink droplets are not discharged from the nozzle 451. In addition, the trapezoidal waveform Bdp2 is a different waveform from the trapezoidal waveform Adp1 (Adp2). When the trapezoidal waveform Bdp2 is supplied to the driver 30 and the piezoelectric element 40 is driven, the waveform causes an amount less than the predetermined amount described above of the ink to be discharged from the nozzle 451.

A voltage at a start timing of the trapezoidal waveforms Adp1, Adp2, Bdp1, and Bdp2 and a voltage at an end timing are both Vc commonly. In addition, the cycle Ta is an inverse number (=1/f) of the frequency f which is determined by the dot distance D and the velocity v of the head unit 20 in the main scanning direction.

Next, the operations of the selection controller 220 and the selection section 230 are described.

Figure 11:
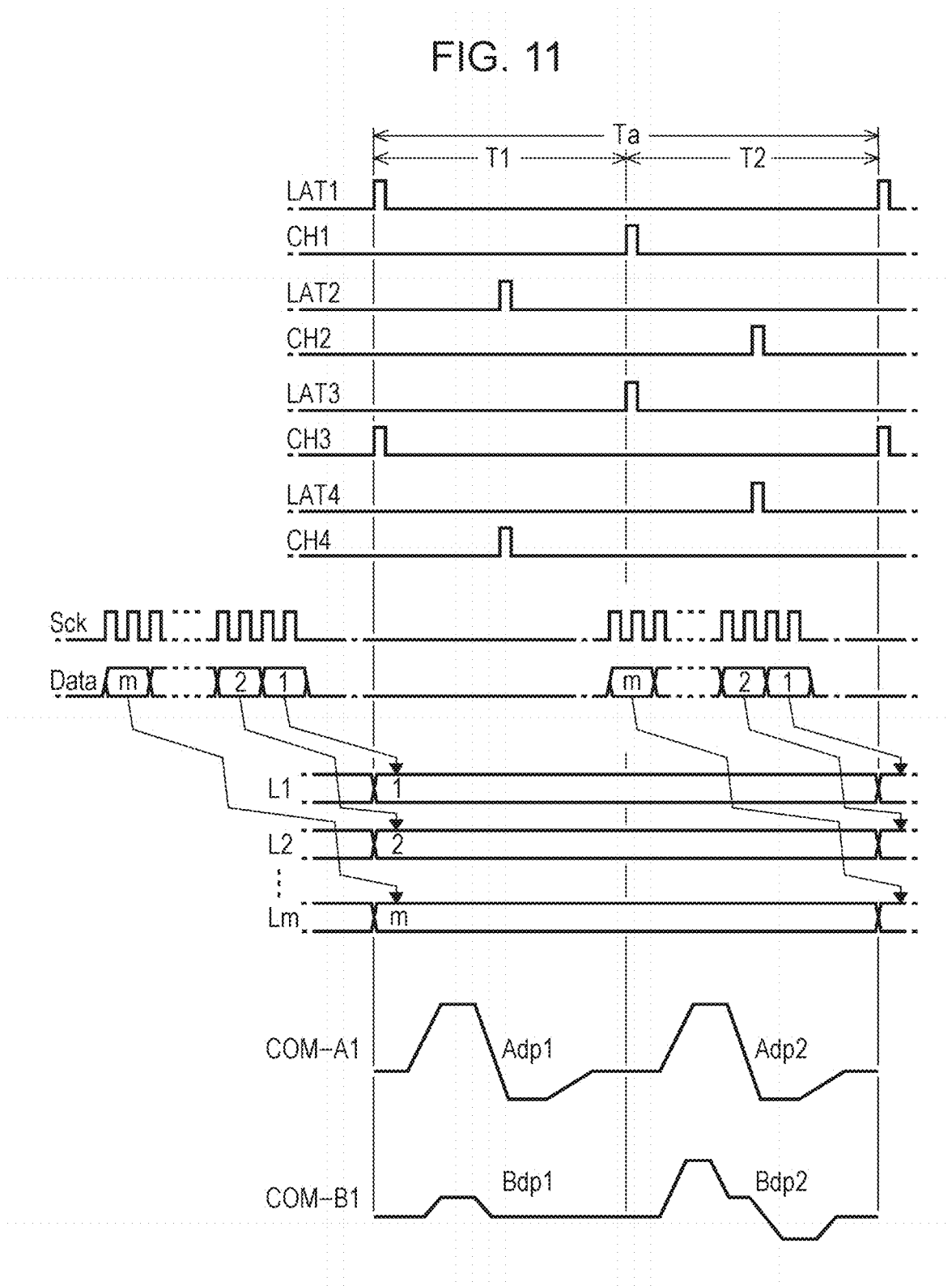
FIG. 11 is a diagram illustrating an operation of the selection controller.

FIG. 11 is a diagram illustrating the operation of the selection controller.

A period from a rise of the control signal LAT1 to a rise of the control signal CH1 of the cycle Ta is defined as a first half period T1 of the first system, and a period from a rise of the control signal CH1 to a rise of the subsequent control signal LAT1 of the cycle Ta is defined as a second half period of the first system.

The control signals LAT2 and CH2 corresponding to the second system are delayed by 90 degrees in the phase with respect to the control signals LAT1 and CH1 of the first system. Similarly, the control signals LAT3 and CH3 corresponding to the third system are delayed by 90 degrees in the phase with respect to the second system. Further, the control signals LAT4 and CH4 corresponding to the fourth system are delayed by 90 degrees in the phase with respect to the third system.

Though not illustrated in FIG. 11, the second system is defined as the periods T1 and T2 by the control signals LAT1 and CH1. The third system and the fourth system are the same. The periods T1 and T2 of the second system, the third system, and the fourth system are delayed sequentially by 90 degrees in the phase with respect to the periods T1 and T2 of the first system.

The data signals Data are synchronized with the clock signals Sck and supplied serially to each of the nozzles from the main controller 120 and transferred sequentially to the shifter registers 222 corresponding to the nozzles. When the supply of the clock signal Sck is stopped, the data signal Data corresponding to the nozzle is in a state of being held in each of the shifter registers 222. The data signal Data is supplied to the nozzles of the m-th stage, . . . , the second stage, and the first stage in the shifter registers 222 in a corresponding order.

Here, in a case where the data signal Data regulates the first system, the latch circuits 224 latch all the data signals Data held in the shifter registers 222 at the rise of the control signal LAT1. In FIG. 11, in a case where the data signal Data regulates the first system, L1, L2, . . . , Lm indicate the data signals Data which are latched by the latch circuits 224 corresponding to the shifter registers 222 of the first stage, the second stage, . . . , and the m-th stage.

Though not illustrated in FIG. 11, in a case where the data signal Data regulates the second system, the data signals Data held in the shifter registers 222 are latched at the rise of the control signal LAT2. Similarly, in a case where the data signals Data regulate the third system and the fourth system, the data signals Data held in the shifter registers 222 are latched at the rise of the control signals LAT3 and LAT4.

In a case where the latched data signals Data regulate the first system, the decoder 226 outputs logic levels of the selection signals Sel-a and Sel-b as illustrated in FIG. 8 according to the amount of ink regulated by the data signal Data in each of the periods T1 and T2 of the first system and the other selection signals Sel-c to Sel-h become L levels.

That is, in a case where the amount of ink regulated by the data signal Data corresponds to the large dot, the selection signal Sel-a in the periods T1 and T2 becomes the H level and Sel-b becomes the L level. In a case where the amount of ink regulated by the data signal Data corresponds to the medium dot, the selection signal Sel-a in the period T1 becomes the H level, Sel-b becomes the L level, the selection signal Sel-a in the period T2 becomes the L level and Sel-b becomes the H level. In a case where the amount of ink regulated by the data signal Data corresponds to the small dot, the selection signals Sel-a and Sel-b in the period T1 become the L level, the selection signal Sel-a in the period T2 becomes the L level and Sel-b becomes the H level. In a case where the amount of ink regulated by the data signal Data corresponds to the non-recording, the selection signal Sel-a in the period T1 becomes the L level, Sel-b becomes the H level, and both of the selection signals Sel-a and Sel-b in the period T2 become the L level.

In a case where the latched data signals Data regulate the second system, similar to the selection signals Sel-a and Sel-b of the first system, the logic levels of the selection signals Sel-c and Sel-d are output according to the amount of ink regulated by the data signal Data in each of the periods T1 and T2 of the second system and the other selection signals become L levels.

In a case where the latched data signals Data regulate the third system, similar to the selection signals Sel-a and Sel-b of the first system, the logic levels of the selection signals Sel-e and Sel-f are output according to the amount of ink regulated by the data signal Data in each of the periods T1 and T2 of the third system and the other selection signals become L levels.

In a case where the latched data signals Data regulate the fourth system, similar to the selection signals Sel-a and Sel-b of the first system, the logic levels of the selection signals Sel-g and Sel-h are output according to the amount of ink regulated by the data signal Data in each of the periods T1 and T2 of the fourth system and the other selection signals become L levels.

Figure 12:
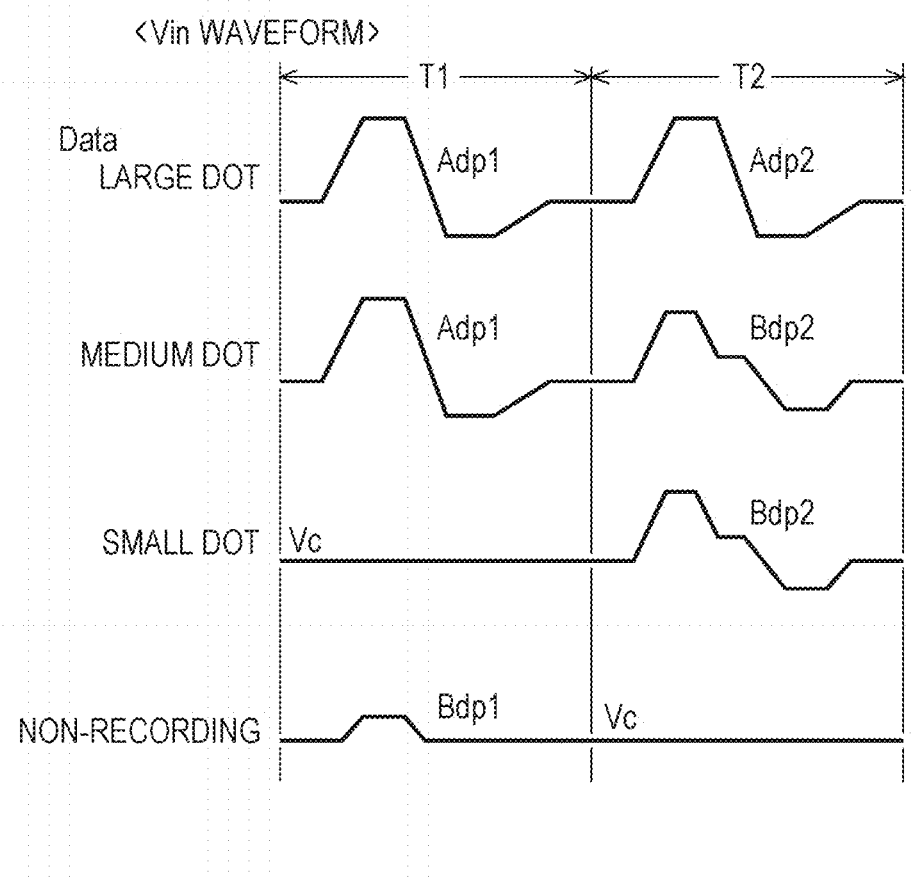
FIG. 12 is a diagram illustrating an original drive signal Vin that is selected by the selection section.

FIG. 12 is a diagram illustrating voltage waveforms of the original drive signal Vin which is selected according to the data signal Data and is supplied to the driver 30.

When the data signal Data regulates the first system and the amount of ink regulated by the data signal Data corresponds to the large dot, the selection signals Sel-a and Sel-b become the H and L levels in the period T1, respectively. Thus, the transfer gate 232a is in a state of ON and other transfer gates are in a state of OFF. Therefore, the trapezoidal waveform Adp1 of the original drive signal COM-A1 is selected.

Meanwhile, at this time, since the selection signals Sel-a and Sel-b become the H and L levels in the period T2, respectively, the trapezoidal waveform Adp2 of the original drive signal COM-A1 is selected.

As above, the trapezoidal waveform Adp1 is selected in the period T1, the trapezoidal waveform Adp2 is selected in the period T2, and then the waveforms are supplied to the driver 30 as the original drive signal Vin. The driver 30 outputs the voltage Vout in accordance with a voltage obtained by amplifying the original drive signal Vin 10 times as will be described later and drives the piezoelectric element 40 corresponding to the nozzle. Therefore, when the trapezoidal waveforms Adp1 and Adp2 are selected as the original drive signals Vin and supplied to the driver 30, a substantially medium amount of ink is discharged twice from the nozzle corresponding to the piezoelectric element 40 that is driven by the driver 30. Accordingly, since the respective inks land and combine on the printing medium, as a result, a large dot as regulated by the data signal Data is formed at the first drive timing system.

When the data signal Data regulates the first system and the amount of ink regulated by the data signal Data corresponds to the medium dot, the selection signals Sel-a and Sel-b become the H and L levels in the period T1, respectively. Therefore, the trapezoidal waveform Adp1 of the original drive signal COM-A1 is selected. Since the selection signals Sel-a and Sel-b become the H and L levels in the period T2, respectively, the trapezoidal waveform Bdp2 of the original drive signal COM-B1 is selected.

Therefore, a substantially medium amount of ink and a substantially small amount of ink are discharged twice from the nozzle. Accordingly, since the respective inks land and combine on the printing medium, as a result, a medium dot as regulated by the data signal Data is formed at the first drive timing system.

When the data signal Data regulates the first system and the amount of ink regulated by the data signal Data corresponds to the small dot, the selection signals Sel-a and Sel-b both become the L level in the period T1. Therefore, neither of the trapezoidal waveforms Adp1 and Bdp1 is selected. However, since the selection signals Sel-a and Sel-b become the L and H levels in the period T2, respectively, the trapezoidal waveform Bdp2 is selected.

Therefore, since a substantially small amount of ink is discharged once from the nozzle in the period T2, as a result, a small dot as regulated by the data signal Data is formed on the printing medium at the first drive timing system.

When the data signal Data regulates the first system and the amount of ink regulated by the data signal Data corresponds to the non-recording, the selection signals Sel-a and Sel-b become the L and H levels in the period T1, respectively. Therefore, the trapezoidal waveform Bdp1 is selected. Meanwhile, since both of the selection signals Sel-a and Sel-b become the L level in the period T2, neither of the trapezoidal waveforms Adp2 and Bdp2 is selected. Therefore, since the ink in the vicinity of the opening of the nozzle is vibrated only minutely in the period T1, but no ink is discharged, as a result, no dot is formed, that is, non-recording as regulated by the data signal Data is performed.

When the data signal Data regulates the second system, the third system, and the fourth system, the operations are the same as above except that the phases are delayed by 90 degrees with respect to the first system.

In addition, in a case where neither of the trapezoidal waveforms is selected, a path to the input end of the driver 30 is in a high impedance state in which the path is not connected electrically to any portion. However, since the voltage Vc that exists before a state of not selecting is held by a capacity component which is parasitic in the path, the voltage of the original drive signal Vin is not in an undetermined state even when neither of the trapezoidal waveforms is selected.

As above, the selection section 230 selects (or does not select) the original drive signals COM-A1 to COM-A4 and COM-B1 to COM-B4 in accordance with the control by the selection controller 220 and supplies the selected signals to the driver 30 as the original drive signal Vin and the driver 30 drives the piezoelectric element 40 by the drive signal in accordance with the voltage of the original drive signal Vin.

Therefore, the piezoelectric element 40 of each nozzle is driven at a drive timing of a system regulated by the corresponding data signal Data and according to an amount of ink regulated by the data signal Data.

The original drive signals COM-A1 to COM-A4 and COM-B1 to COM-B4 illustrated in FIG. 10 or FIG. 12 are only examples. Practically, a combination of various waveforms prepared in advance is used according to the movement speed of the head unit, properties of the printing medium, or the like.

In addition, an example in which the piezoelectric element 40 is bent upward along with an increase of the voltage is described, but when the voltage to be supplied to the electrodes 411 and 412 is inverted, the piezoelectric element 40 is bent downward along with the increase of the voltage. Therefore, in a configuration in which the piezoelectric element 40 is bent downward along with the increase of the voltage, the original drive signals COM-A1 to COM-A4 and COM-B1 to COM-B4 illustrated in the drawings have waveforms inverted with the voltage Vc as a reference.

Figure 13:
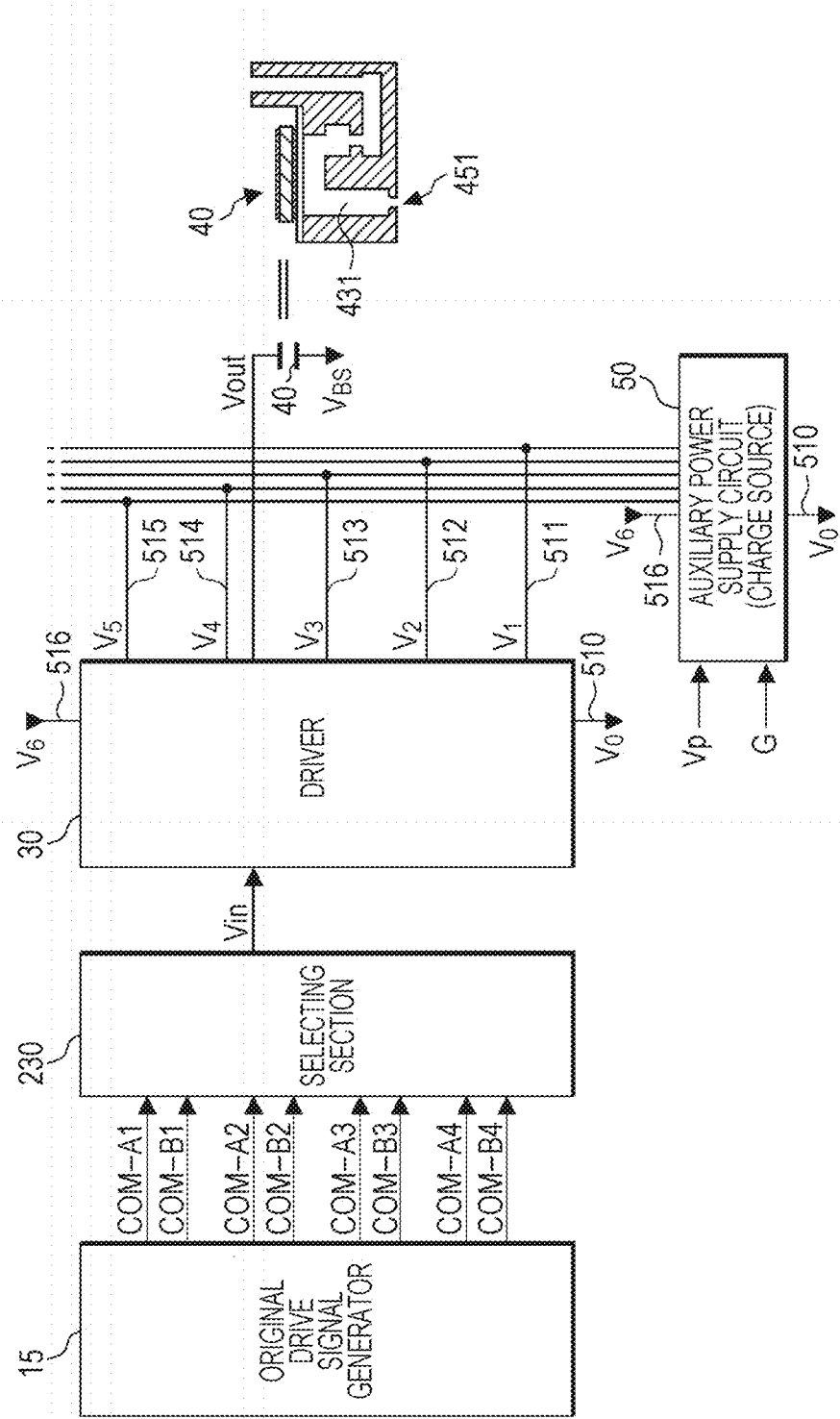
FIG. 13 is a block diagram illustrating a configuration of main components in the printing apparatus.

FIG. 13 is a block diagram illustrating a configuration of main components when focusing on a set of the driver 30 and the piezoelectric element 40 in the printing apparatus 1.

As described above, the original drive signal COM-A1 to COM-A4 and COM-B1 to COM-B4 to be supplied to the selection section 230 are the analog signals obtained by converting digital data A1 to A4 and B1 to B4 output from the main controller 120 by the DACs 161 to 168. Therefore, in FIG. 13, the original drive signal generator 15 is illustrated as a block in which the main controller 120 and the DACs 161 to 168 are included and is illustrated to have a configuration in which the original drive signals COM-A1 to COM-A4 and COM-B1 to COM-B4 are generated and supplied to the selection section 230.

The selection section 230 selects (or, replaces with the voltage Vc) any one of the original drive signals COM-A1 to COM-A4 and COM-B1 to COM-B4 in accordance with the control by the selection controller 220 (not illustrated in FIG. 13) and supplies the selected signal as the original drive signal Vin to the driver 30.

The auxiliary power supply circuit 50, that is, the charge source, divides the power supply voltages Vp and G that are supplied from the main power supply circuit 180 into six and outputs the result. In short, the auxiliary power supply circuit 50 divides the power supply voltages (Vp and G) into six and outputs voltages $V_5$, $V_4$, $V_3$, $V_2$, and $V_1$ as intermediate voltages thereof in descending order.

The voltages $V_6$ to $V_0$ and the voltage Vp have relationships as follows:
$V_6 = Vp$,
$V_5 = 5Vp/6$,
$V_4 = 4Vp/6$,
$V_3 = 3Vp/6$,
$V_2 = 2Vp/6$,
$V_1 = Vp/6$, and
$V_0 = G$ (=0).

In addition, the voltages $V_0$ to $V_6$ are supplied to the plurality of drivers 30 commonly through wires 510 to 516, respectively.

The piezoelectric element 40 is provided corresponding to each of the plurality of nozzles in the head unit 20 and is driven by the driver 30 as a counterpart set to the piezoelectric element. That is, the piezoelectric element 40 is configured to be driven by the drive signal (voltage Vout) which is output from the driver 30.

Figure 14:
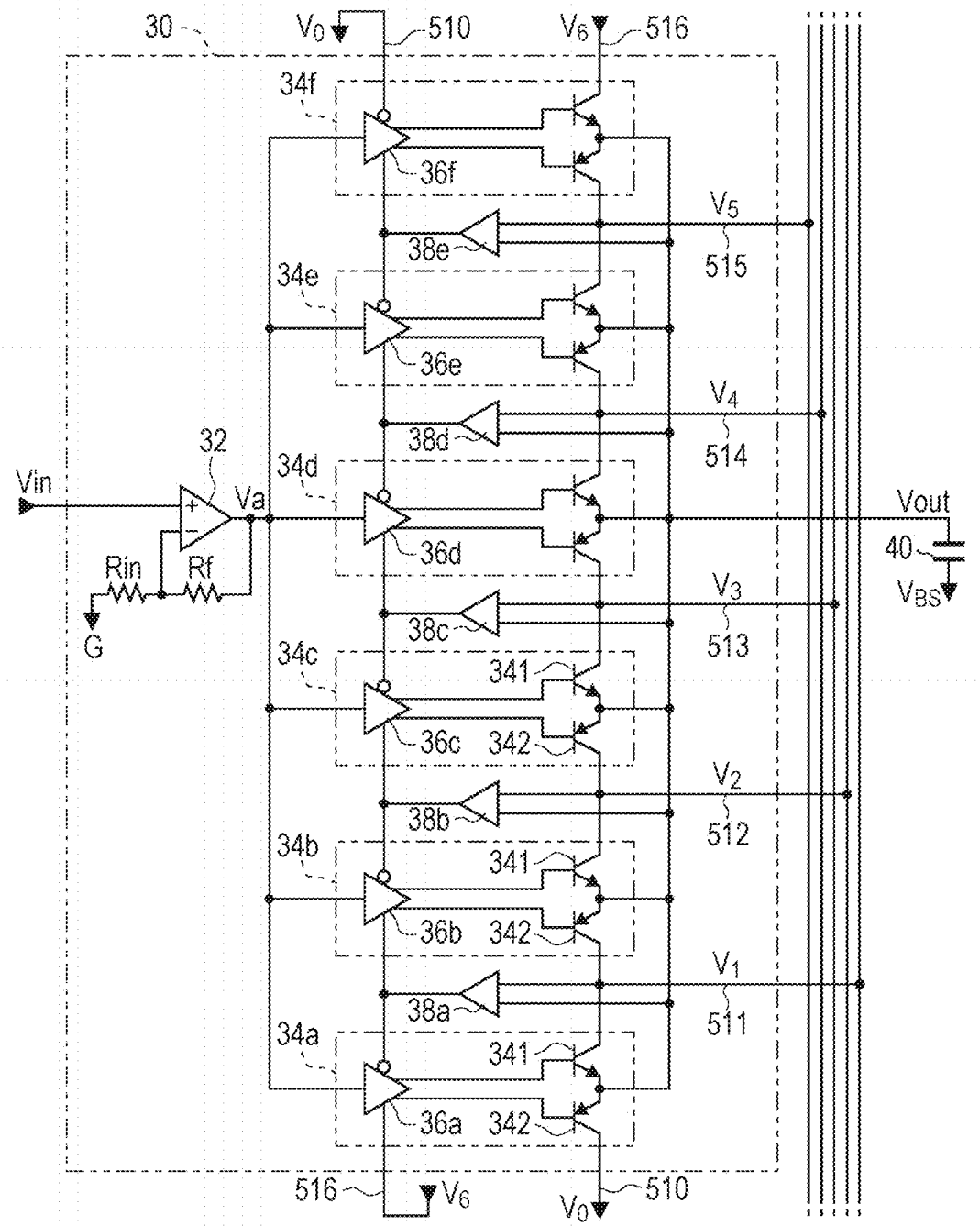
FIG. 14 is a diagram illustrating an example of a configuration of a driver in the head unit.

FIG. 14 is a diagram illustrating an example of a configuration of the driver 30 that drives one piezoelectric element 40.

As illustrated in FIG. 14, the driver 30 includes an operational amplifier 32, unit circuits 34*a* to 34*f,* and comparators 38*a* to 38*e*, and is configured to drive the piezoelectric element 40 in accordance with the original drive signal Vin.

The original drive signal Vin selected by the selection section 230 is supplied to an input end (+) of the operational amplifier 32 which is the input end of the driver 30.

An output signal of the operational amplifier 32 is supplied to each of the unit circuits 34*a* to 34*f,* returns to the input end (−) of the operational amplifier 32 by negative feedback through resistance Rf, and is grounded to the ground G further through resistance Rin. Therefore, the operational amplifier 32 causes the original drive signal Vin to be subjected to (1+Rf/Rin) times of non-inverting amplification.

A voltage amplification rate of the operational amplifier 32 can be set by the resistances Rf and Rin, but Rf:Rin is set to 9:1 according to the present embodiment for the sake of convenience. Therefore, hereinafter, the voltage amplification rate of the operational amplifier 32 is set to "10", that is, the voltage of the original drive signal Vin becomes 10 times as high and the voltage is supplied as the original drive signal Va to the unit circuits 34*a* to 34*f*.

That is, when the voltage range of the original drive signal Vin is 0 volts to 4.2 volts, the voltage range of the original drive signal Va is expanded to be 0 volts to 42 volts. The voltage amplification rate may be any number in addition to "10".

The unit circuits 34*a* to 34*f* are provided in ascending order of the voltages corresponding to two adjacent voltages to each other from seven types of voltages $V_6$ to $V_0$. To be more specific, the unit circuit 34*a* corresponds to the voltage $V_0$ and the voltage $V_1$,
the unit circuit 34*b* corresponds to the voltage $V_1$ and the voltage $V_2$,
the unit circuit 34*c* corresponds to the voltage $V_2$ and the voltage $V_3$,
the unit circuit 34*d* corresponds to the voltage $V_3$ and the voltage $V_4$,
the unit circuit 34*e* corresponds to the voltage $V_4$ and the voltage $V_5$, and
the unit circuit 34*f* corresponds to the voltage $V_5$ and the voltage $V_6$.

Circuit configurations of the unit circuits 34*a* to 34*f* are the same as each other, and each includes one corresponding level shifter of the level shifters 36*a* to 36*f,* a bipolar NPN type (P type) transistor 341, and a PNP type (N type) transistor 342.

When the unit circuits 34*a* to 34*f* are described not particularly but generally, the unit circuit is described only with a reference number "34". Similarly, when level shifters 36*a* to 36*f* are described not particularly but generally, the level shifter is described only with a reference number "36".

The level shifter 36 has one state of an enable status and a disable status. To be more specific, when an L-level signal is supplied to a negative control end to which a circle is attached and an H-level signal is supplied to a positive control end to which no circle is attached, the level shifter 36 enters the enable status. Otherwise, the level shifter 36 is in a disable status.

As will be described later, the comparators 38*a* to 38*e* are each associated with the intermediate five types of voltages $V_1$ to $V_5$ of the above seven types of voltages, one to one.

Here, when a certain unit circuit 34 is focused on, an output signal of the comparator associated with a higher-side voltage of the two voltages corresponding to the unit circuit 34 is supplied to the negative control end of the level shifter 36 in the unit circuit 34. An output signal of the comparator associated with a lower-side voltage of the two voltages corresponding to the unit circuit 34 is supplied to the positive control end of the level shifter 36.

However, while the negative control end of the level shifter 36*f* in the unit circuit 34*f* is connected to the wire 510 which supplies the voltage $V_0$ (L level), the positive control end of the level shifter 36*a* in the unit circuit 34*a* is connected to the wire 516 which supplies the voltage $V_6$ (H level).

In addition, in the enable status, the level shifter 36 shifts the voltage of the original drive signal Va by a predetermined value in a minus direction and supplies the result to a base terminal of the transistor 341, and simultaneously, the level shifter 36 shifts the voltage of the original drive signal Va by a predetermined value in a plus direction and supplies the result to a base terminal of the transistor 342. In the disable status, regardless of the original drive signal Va, the level shifter 36 supplies a voltage that causes the transistor 341 to be in the OFF state, for example, the voltage $V_6$, to the base terminal of the transistor 341, and simultaneously, supplies a voltage that causes the transistor 342 to be in the ON state, for example, the voltage $V_0$, to the base terminal of the transistor 342.

The predetermined value is set to a voltage (bias voltage, substantially 0.6 volts) between the base-emitter which is measured when a current starts to flow to the emitter terminal. That is, the predetermined value is a property determined according to the characteristics of the transistors 341 and 342 and becomes zero if the transistors 341 and 342 are in an ideal state.

A higher-side voltage of the corresponding two voltages is supplied to a collector terminal of the transistor 341, and a lower-side voltage is supplied to a collector terminal of the transistor 342.

For example, in the unit circuit 34*a* corresponding to the voltage $V_0$ and voltage $V_1$, the collector terminal of the transistor 341 is connected to the wire 511 which supplies the voltage V' and the collector terminal of the transistor 342 is connected to the wire 510 which supplies the voltage $V_0$. In addition, in the unit circuit 34*b* corresponding to the voltage $V_1$ and voltage $V_2$, the collector terminal of the transistor 341 is connected to the wire 512 which supplies the voltage $V_2$ and the collector terminal of the transistor 342 is connected to the wire 511 which supplies the voltage V'. In the unit circuit 34*f* corresponding to the voltage $V_5$ and voltage $V_6$, the collector terminal of the transistor 341 is connected to the wire 516 which supplies the voltage $V_6$ and the collector terminal of the transistor 342 is connected to the wire 515 which supplies the voltage $V_5$.

Meanwhile, emitter terminals of the transistors 341 and 342 in the unit circuits 34*a* to 34*f* are connected commonly to an end of the piezoelectric element 40 and a common connection point of the emitter terminals of the transistors 341 and 342 is connected to an end of the piezoelectric element 40 as an output end of the drive signal.

A voltage of one end of the piezoelectric element 40, that is, a voltage of the drive signal, is described as Vout.

The comparators 38a to 38e corresponding to five types of voltages $V_1$ to $V_5$, respectively, compare the high and low of the voltages supplied to two input ends and output a signal indicating the compared result. Here, the corresponding voltage is supplied to one end of the two input ends in the comparators 38a to 38e and the other end is connected commonly to the emitter terminals of the transistors 341 and 342 and one end of the piezoelectric element 40. For example, in the comparator 38a corresponding to the voltage $V_1$, the corresponding voltage $V_1$ is supplied to one end of the two input ends and in the comparator 38b corresponding to the voltage $V_2$, the corresponding voltage $V_2$ is supplied to one end of the two input ends.

Each of the comparators 38a to 38e outputs an H-level (voltage $V_6$) signal when the voltage Vout at one end of the input end is equal to or higher than the voltage of the other end, and outputs an L-level (voltage $V_0$) signal when the voltage Vout is less than the voltage of the other end.

Specifically, the comparator 38a outputs an H-level signal when the voltage Vout is equal to or higher than the voltage $V_1$, and outputs an L-level signal when the voltage Vout is less than the voltage $V_1$. In addition, the comparator 38b outputs an H-level signal when the voltage Vout is equal to or higher than the voltage $V_2$, and outputs an L-level signal when the voltage Vout is less than the voltage $V_2$.

When one voltage is focused on out of the five types of voltages, the configuration is the same as above in that the output signal from the comparator corresponding to the focused-on voltage is supplied to both of a negative input end of the level shifter 36 of the unit circuit in which the voltage becomes the higher-side voltage and a positive input end of the level shifter 36 of the unit circuit in which the voltage becomes the lower-side voltage.

For example, the output signal from the comparator 38a corresponding to the voltage $V_1$ is supplied to both of a negative input end of the level shifter 36a of the unit circuit 34a with which the voltage $V_1$ is associated as the higher-side voltage and a positive input end of the level shifter 36b of the unit circuit 34b with which the voltage $V_1$ is associated as the lower-side voltage. In addition, the output signal from the comparator 38b corresponding to the voltage $V_2$ is supplied to both of a negative input end of the level shifter 36b of the unit circuit 34b with which the voltage $V_2$ is associated as the higher-side voltage and a positive input end of the level shifter 36c of the unit circuit 34c with which the voltage $V_2$ is associated as the lower-side voltage.

When the voltages $V_1$, $V_2$, ... represent a first voltage, a second voltage, ..., respectively, the wires 511, 512, ..., correspond to a first signal path, a second signal path, ..., respectively.

Next, the operation of the driver 30 will be described.

First, statuses of the level shifters 36a to 36f with respect to the voltage Vout at one end in the piezoelectric element 40 are described.

FIG. 15 is a diagram illustrating a range of a voltage in which the level shifters 36a to 36f are in the enable status with respect to the voltage Vout.

First, in a first status in which the voltage Vout is less than the voltage $V_1$, the output signals from the comparators 38a to 38e all have the L level. Therefore, in the first status, only the level shifter 36a is in the enable status and the other level shifters 36b to 36f are in the disable status.

In a second status in which the voltage Vout is equal to or higher than the voltage $V_1$ and less than the voltage $V_2$, only the output signal from the comparator 38b becomes the H level and the output signals from the other comparators become the L level. Accordingly, in the second status, only the level shifter 36b is in the enable status and the other level shifters 36a and 36c to 36f are in the disable status.

Next, in a third status in which the voltage Vout is equal to or higher than the voltage $V_2$ and less than the voltage $V_3$, only the level shifter 36c is in the enable status. In a fourth status in which the voltage Vout is equal to or higher than the voltage $V_3$ and less than the voltage $V_4$, only the level shifter 36d is in the enable status. In a fifth status in which the voltage Vout is equal to or higher than the voltage $V_4$ and less than the voltage $V_5$, only the level shifter 36e is in the enable status. In a sixth status in which the voltage Vout is equal to or higher than the voltage $V_5$, only the level shifter 36f is in the enable status.

When the level shifter 36a is in the enable status in the first status, the level shifter 36a supplies a voltage signal on which the level shifting of the original drive signal Va by a predetermined value is performed in the minus direction to the base terminal of the transistor 341 in the unit circuit 34a, and supplies a voltage signal on which the level shifting of the original drive signal Va by the predetermined value is performed in the plus direction to the base terminal of the transistor 342 in the unit circuit 34a.

Here, when the voltage of the original drive signal Va is higher than the voltage Vout (voltage of the connection point of the emitter terminals to each other), a current in accordance with the difference (voltage between the base-emitter, to be more exact, voltage obtained by subtracting a predetermined value from the voltage between the base-emitter) flows from the collector terminal of the transistor 341 to the emitter terminal thereof. Therefore, when the voltage Vout is gradually increased and approaches the voltage of the original drive signal Va and eventually the voltage Vout reaches the voltage of the original drive signal Va, the current flowing to the transistor 341 becomes zero at this time.

Meanwhile, when the voltage of the original drive signal Va is lower than the voltage Vout, a current in accordance with the difference flows from the emitter terminal of the transistor 342 to the collector terminal thereof. Therefore, when the voltage Vout is gradually lowered and approaches the voltage of the original drive signal Va and eventually the voltage Vout reaches the voltage of the original drive signal Va, the current flowing to the transistor 342 becomes zero at this time.

Accordingly, in the first status, the transistors 341 and 342 of the unit circuit 34a execute control of the voltage Vout to reach the original drive signal Va.

Since, in the first status, the level shifter 36 is in the disable status in the unit circuits 34b to 34f except for the unit circuit 34a, the voltage $V_6$ is supplied to the base terminal of the transistor 341 and the voltage $V_0$ is supplied to the base terminal of the transistor 342. Therefore, since, in the first status, the transistors 341 and 342 are in the OFF state in the unit circuits 34b to 34f, the transistors 341 and 342 are not involved in the control of the voltage Vout.

Here, the operation in the first status is described, and the operations in the second to sixth statuses are the same. To be more specific, any one of the unit circuits 34a to 34f is activated according to the voltage Vout held in the piezoelectric element 40, and the activated transistors 341 and 342 of the unit circuit 34 control the voltage Vout to reach the original drive signal Va. Therefore, regarding all of the drivers 30, the voltage Vout is caused to follow the voltage of the original drive signal Va.

Figure 16A:
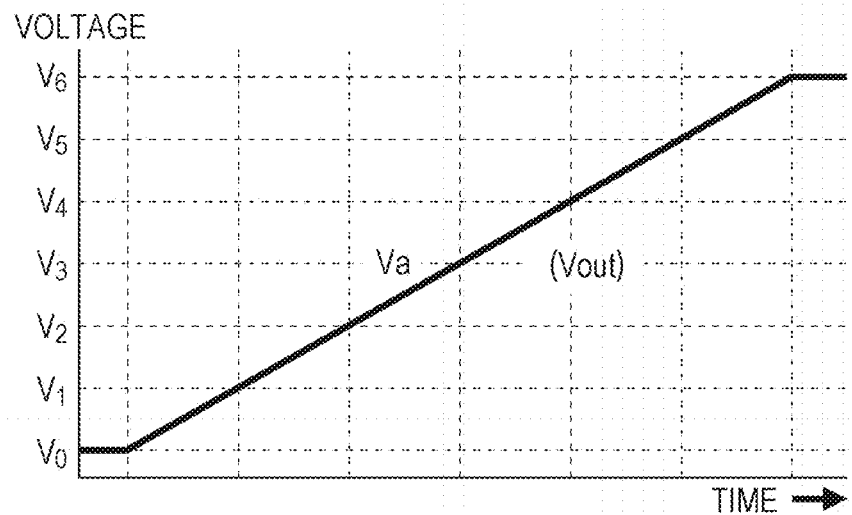
FIGS. 16A and 16B are diagrams illustrating examples of relationships between inputs and outputs in the driver.
Figure 16B:
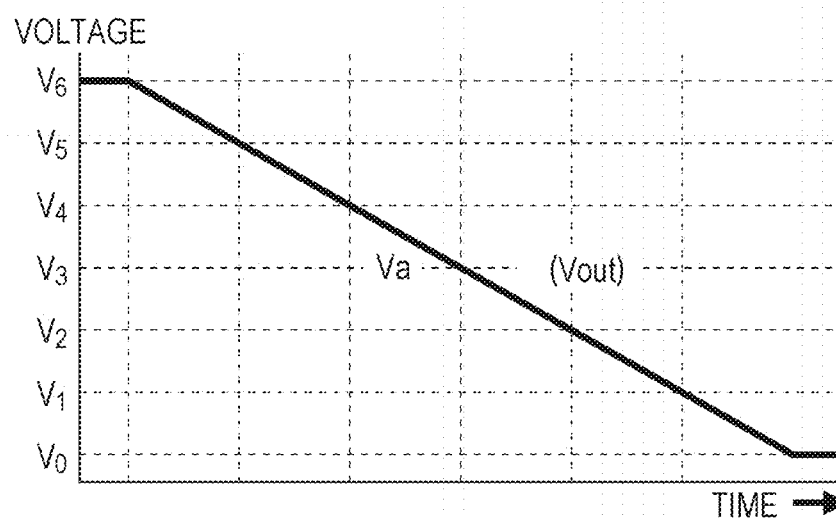

Accordingly, as illustrated in FIG. 16A, when the original drive signal Va is increased, for example, from the voltage $V_0$ to voltage $V_6$, the voltage Vout follows the original drive signal Va and also changes from the voltage $V_0$ to voltage $V_6$. In addition, as illustrated in FIG. 16B, when the original drive signal Va is lowered from the voltage $V_6$, the voltage Vout follows the original drive signal Va and also changes from the voltage $V_6$.

Figure 17A:
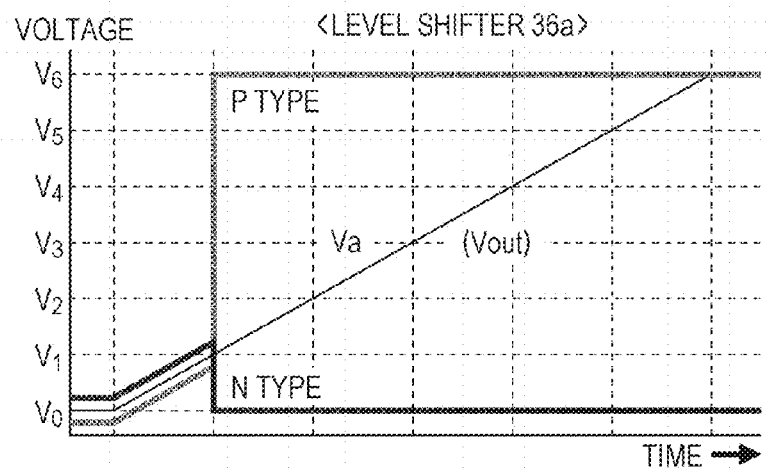
FIGS. 17A, 17B, and 17C are diagrams illustrating examples of relationships between inputs and outputs in the level shifter.
Figure 17B:
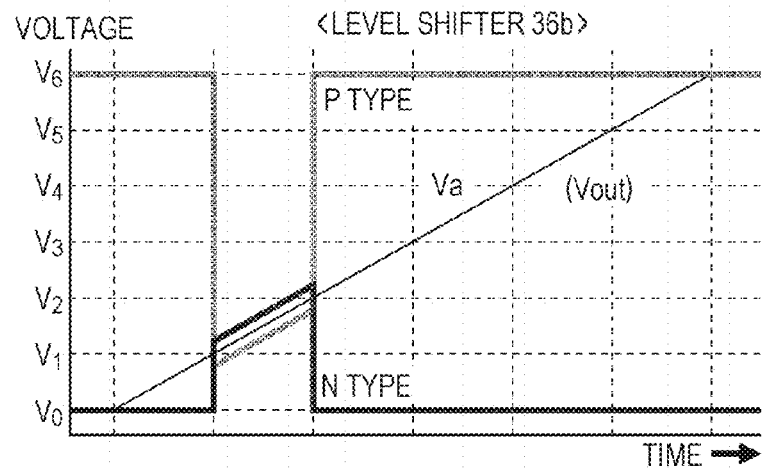
Figure 17C:
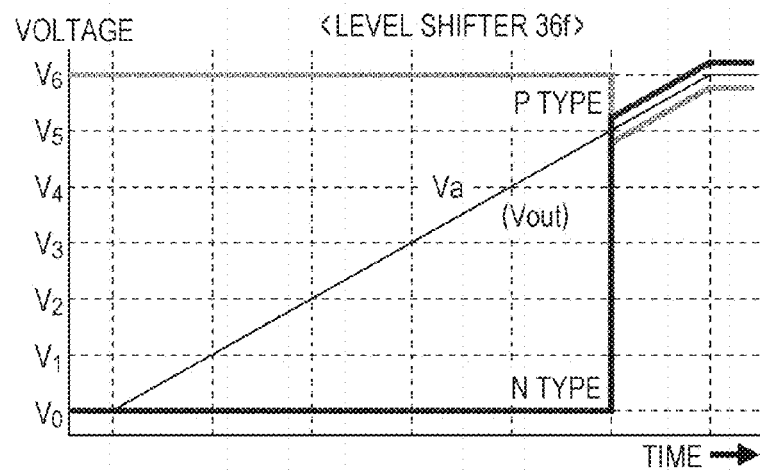

FIGS. 17A to 17C are diagrams illustrating the operation of the level shifter.

When the original drive signal Va changes to be increased from the voltage $V_0$ to voltage $V_6$, the voltage Vout is increased to follow the original drive signal Va. In this increasing process, in the first status in which the voltage Vout is less than the voltage $V_1$, the level shifter 36a enters the enable status. Therefore, as illustrated in FIG. 17A, the voltage (written as "P type") which is supplied to the base terminal of the transistor 341 by the level shifter 36a becomes the voltage on which the shifting of the original drive signal Va by the predetermined value is performed in the minus direction, and the voltage (written as "N type") which is supplied to the base terminal of the transistor 342 becomes the voltage on which the shifting of the original drive signal Va by the predetermined value is performed in the plus direction. Meanwhile, in the statuses other than the first status, since the level shifter 36a is in the disable status, the voltage that is supplied to the base terminal of the transistor 341 becomes $V_6$ and the voltage that is supplied to the base terminal of the transistor 342 becomes $V_0$.

FIG. 17B illustrates a voltage waveform output from the level shifter 36b and FIG. 17C illustrates a voltage waveform output from the level shifter 36f. As long as heed is paid to the process in which the level shifter 36b enters the enable status in the second status in which the voltage Vout is equal to or higher than the voltage $V_1$ and less than the voltage $V_2$, and the level shifter 36f enters the enable status in the sixth status in which the voltage Vout is equal to or higher than the voltage $V_5$ and less than the voltage $V_6$, a specific description is not necessary.

In addition, a description of the operations of the level shifters 36c to 36e in the process of increasing the voltage (or voltage Vout) of the original drive signal Va or a description of the operations of the level shifters 36a to 36f in the process of lowering the voltage (or voltage Vout) of the original drive signal Va is omitted.

Next, flow of the current (charge) in the unit circuits 34a to 34f will be described by taking examples of the unit circuits 34a and 34b both during charging and during discharging.

Figure 18:
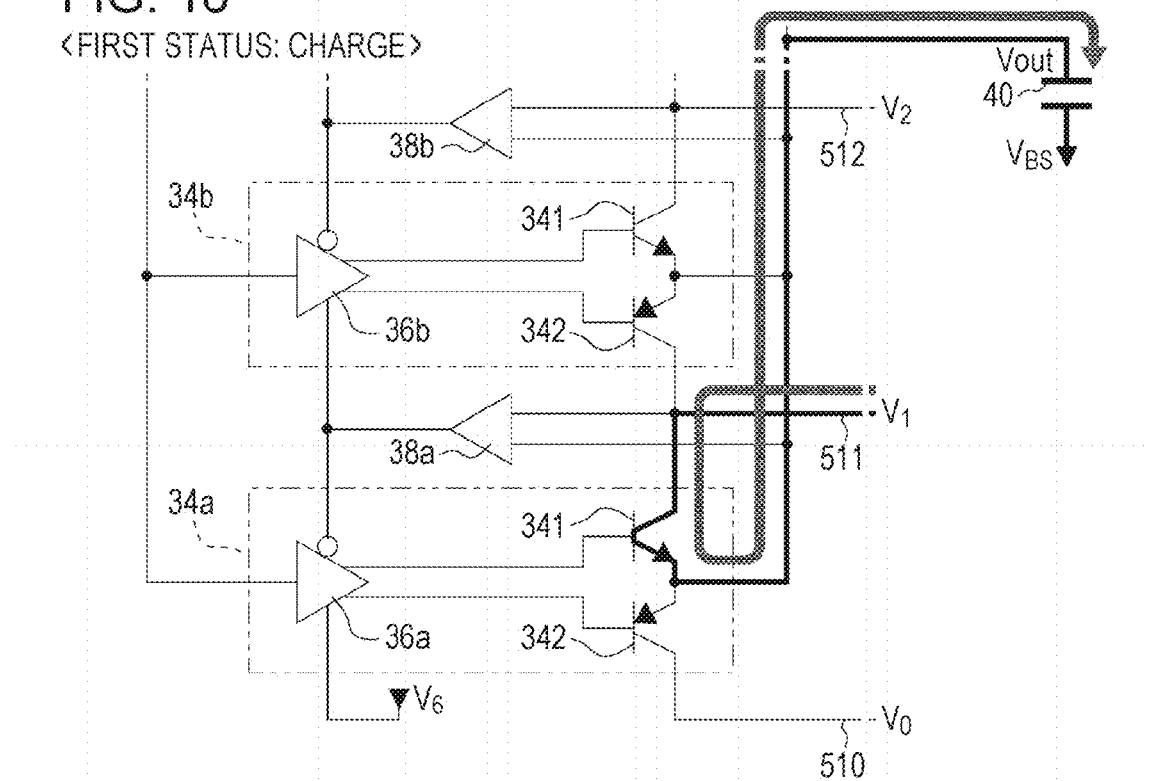
FIG. 18 is a diagram illustrating flow of a current (charge) in the driver.

FIG. 18 is a diagram illustrating the operation of the piezoelectric element 40 which is charged in the first status (status in which the voltage Vout is less than voltage $V_1$).

Since, in the first status, the level shifter 36a is in the enable status and the other level shifters 36b to 36f are in the disable status, only the unit circuit 34a may be focused on.

When the voltage of the original drive signal Va is higher than the voltage Vout in the first status, the transistor 341 of the unit circuit 34a causes the current to flow in accordance with the voltage between the base-emitter. Meanwhile, the transistor 342 of the unit circuit 34a is in the OFF state.

During the charging in the first status, the current flows through a path from the wire 511 through the transistor 341 (of the unit circuit 34a) to the piezoelectric element 40 as illustrated by an arrow in FIG. 18 such that the piezoelectric element 40 is charged with the charge. The voltage Vout is increased by the charging. Eventually, when the voltage Vout approaches and reaches the voltage of the original drive signal Va, the transistor 341 of the unit circuit 34a enters the OFF state and thus the charging of the piezoelectric element 40 is stopped.

Meanwhile, in a case where the original drive signal Va is increased to be equal to or higher than the voltage $V_1$, the voltage Vout follows the original drive signal Va and becomes equal to or higher than the voltage $V_1$. Therefore, the status is changed from the first status to the second status (status in which the voltage Vout is equal to or higher than the voltage $V_1$ and less than the voltage $V_2$).

Figure 19:
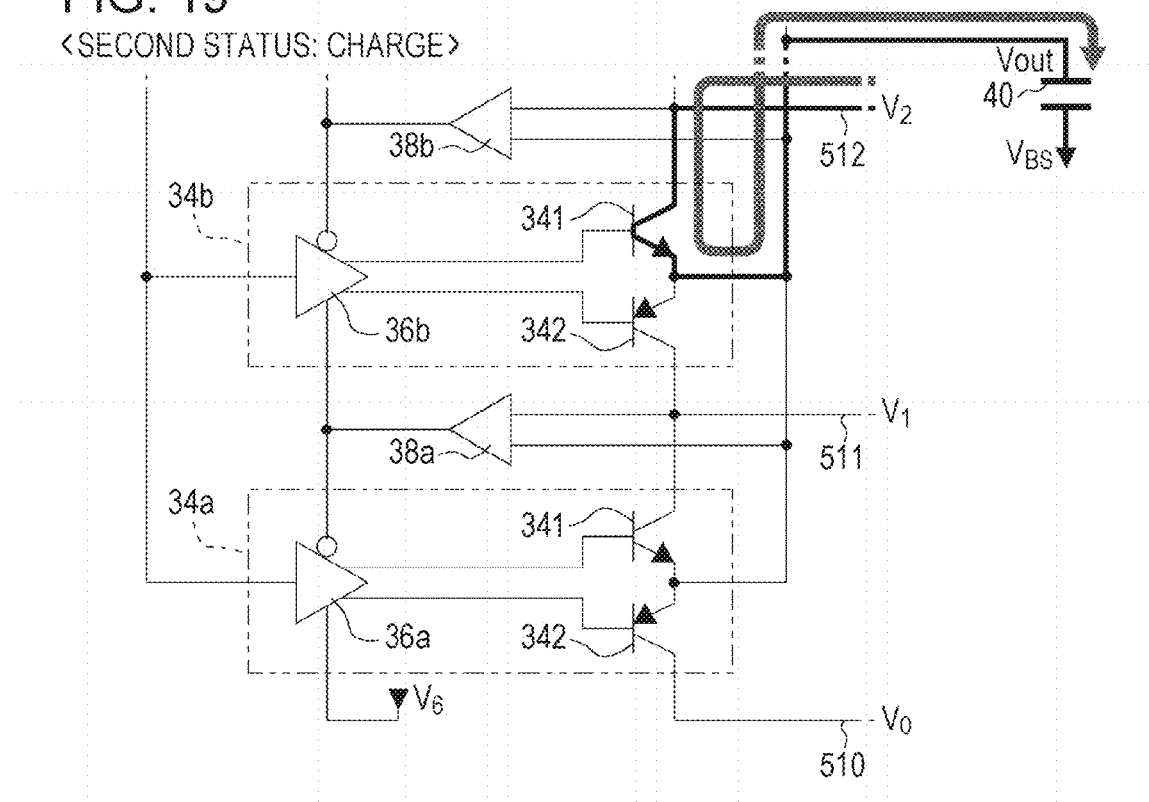
FIG. 19 is a diagram illustrating flow of the current (charge) in the driver.

FIG. 19 is a diagram illustrating the operation of the piezoelectric element 40 which is charged in the second status.

In the second status, since the level shifter 36b is in the enable status and the other level shifters 36a and 36c to 36f are in the disable status, only the unit circuit 34b may be focused on.

When the voltage of the original drive signal Va is higher than the voltage Vout in the second status, the transistor 341 of the unit circuit 34b causes the current to flow in accordance with the voltage between the base-emitter. Meanwhile, the transistor 342 of the unit circuit 34b is in the OFF state.

During the charging in the second status, the current flows through a path from the wire 512 through the transistor 341 (of the unit circuit 34b) to the piezoelectric element 40 as illustrated by an arrow in FIG. 19 such that the piezoelectric element 40 is charged with the charge. That is, in a case where the piezoelectric element 40 is charged in the second status, one end of the piezoelectric element 40 is connected electrically to the auxiliary power supply circuit 50 through the wire 512.

When the status is changed from the first status to the second status during the increase of the voltage Vout, a current supplying source switches from the wire 511 to the wire 512.

Eventually, when the voltage Vout approaches and reaches the voltage of the original drive signal Va, the transistor 341 of the unit circuit 34b enters the OFF state and thus the charging of the piezoelectric element 40 is stopped.

Meanwhile, in a case where the original drive signal Va is increased to be equal to or higher than the voltage $V_2$, the voltage Vout follows the original drive signal Va and becomes equal to or higher than the voltage $V_2$. As a result, the status is changed from the second status to the third status (status in which the voltage Vout is equal to or higher than the voltage $V_2$ and less than the voltage $V_3$).

Since the charging operations in the third status to the sixth status are substantially the same as above, the current (charge) supplying sources switch to wires 513, 514, 515, and 516 sequentially (not particularly illustrated).

Figure 20:
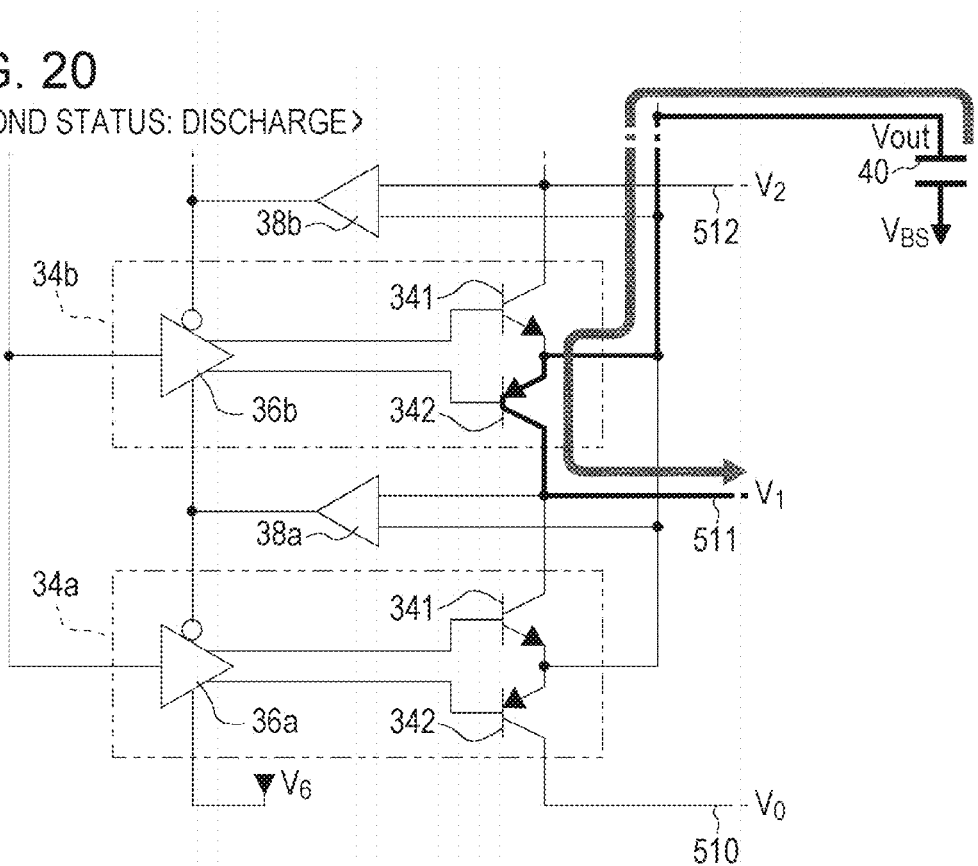
FIG. 20 is a diagram illustrating flow of the current (charge) in the driver.

FIG. 20 is a diagram illustrating the operation of the piezoelectric element 40 which is discharged in the second status.

In the second status, the level shifter 36b is in the enable status. When the voltage of the original drive signal Va is lower than the voltage Vout in this status, the transistor 342 of the unit circuit 34b causes the current to flow in accordance with the voltage between the base-emitter. Meanwhile, the transistor 341 of the unit circuit 34b is in the OFF state.

During the discharging in the second status, the current flows through a path from the piezoelectric element 40 through the transistor 342 (of the unit circuit 34b) to the wire 511 as illustrated by an arrow in FIG. 20 such that the charge is discharged from the piezoelectric element 40. That is, in a case where the charge is charged in the piezoelectric element 40 in the first status, and in a case where the charge is discharged from the piezoelectric element 40 in the second status, one end of the piezoelectric element 40 is connected electrically to the auxiliary power supply circuit 50 through the wire 511. In addition, the wire 511 supplies the current (charge) during the charging in the first status and collects the current (charge) during the discharging in the second status. The collected charge is redistributed and reused by the auxiliary power supply circuit 50.

Eventually, when the voltage Vout approaches and reaches the voltage of the original drive signal Va, the transistor 342 of the unit circuit 34b enters the OFF state and thus the discharging of the piezoelectric element 40 is stopped.

Meanwhile, in a case where the original drive signal Va is lowered to be less than the voltage $V_1$, the voltage Vout follows the original drive signal Va and becomes less than the voltage $V_1$. As a result, the status is changed from the second status to the first status.

Figure 21:
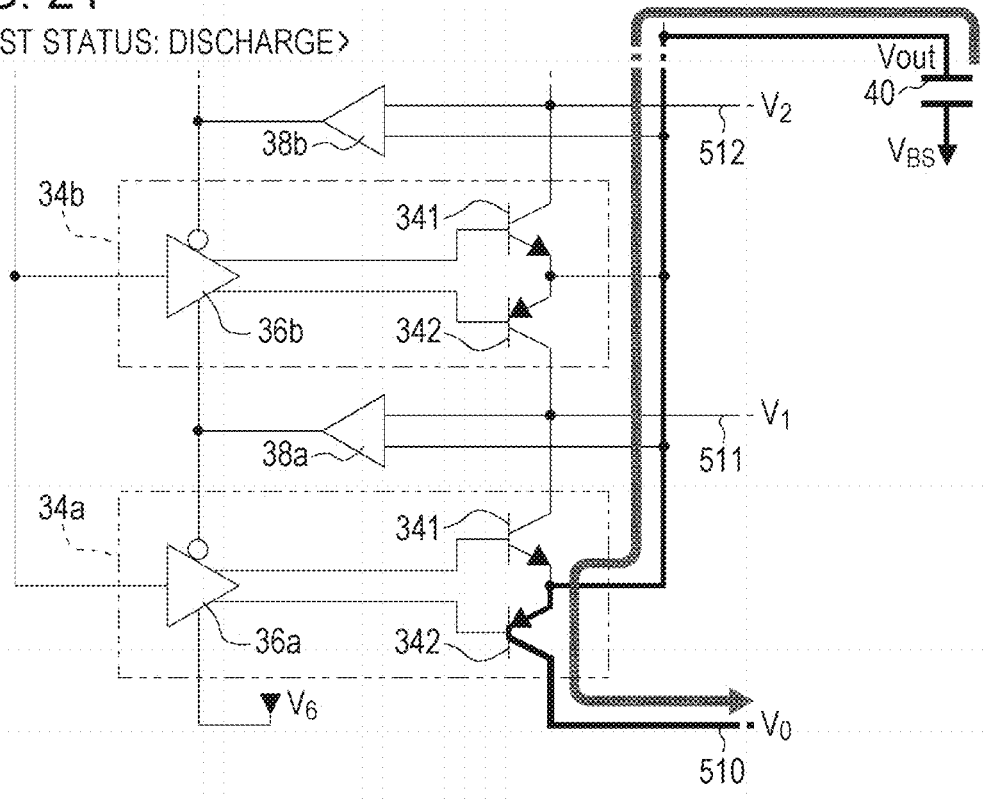
FIG. 21 is a diagram illustrating flow of the current (charge) in the driver.

FIG. 21 is a diagram illustrating the operation of the piezoelectric element 40 which is discharged in the first status.

In the first status, the level shifter 36a is in the enable status. When the voltage of the original drive signal Va is lower than the voltage Vout in this status, the transistor 342 of the unit circuit 34a causes the current to flow in accordance with the voltage between the base-emitter.

At this time the transistor 341 of the unit circuit 34a is in the OFF state.

During the discharging in the first status, the current flows through a path from the piezoelectric element 40 through the transistor 342 (of the unit circuit 34a) to the wire 510 as illustrated by an arrow in FIG. 21 such that the charge is discharged from the piezoelectric element 40.

Here, the unit circuits 34a and 34b are described as examples both during the charging and during the discharging. The unit circuits 34c to 34f operate in substantially the same way except that the transistors 341 and 342 which control the current are different.

In addition, in the discharge path and the charge path in each status, the path from one end of the piezoelectric element 40 to the connection point of the emitter terminals to each other in the transistors 341 and 342 is shared.

According to the present embodiment as above, The voltage Vout of the drive signal is controlled to follow the voltage of the original drive signal Va.

Next, the auxiliary power supply circuit 50 will be described.

Figure 22:
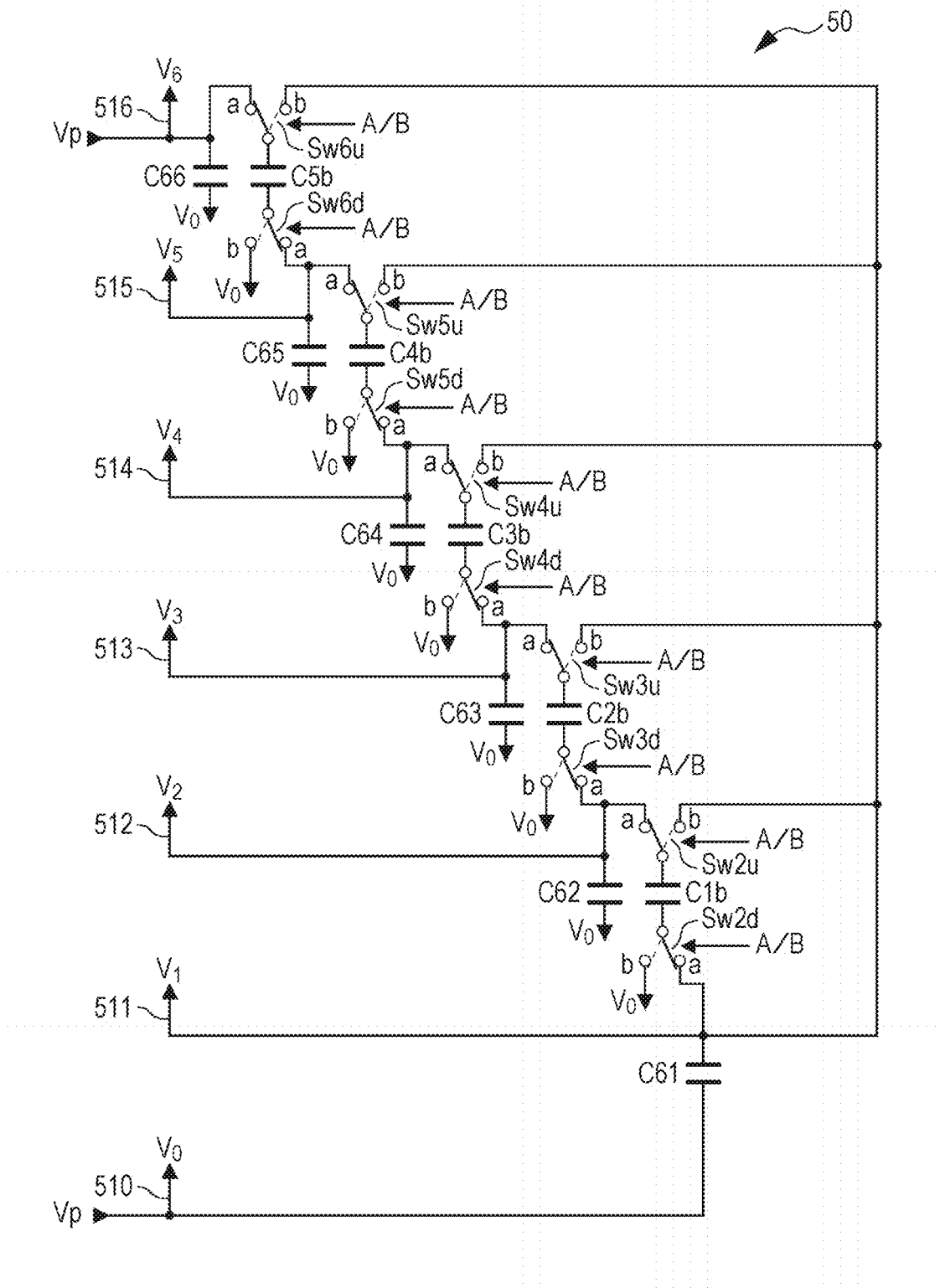
FIG. 22 is a diagram illustrating an example of a configuration of an auxiliary power supply circuit.

FIG. 22 is a diagram illustrating an example of a configuration of an auxiliary power supply circuit 50.

As illustrated in FIG. 22, the auxiliary power supply circuit 50 is configured to have switches Sw2d, Sw2u, Sw3d, Sw3u, Sw4d, Sw4u, SwSd, SwSu, Sw6d, and Sw6u, and capacitive elements C61, C62, C63, C64, C65, C66, C1b, C2b, C3b, C4b, and C5b.

Among these components, the switches are all one-pole two-throw (single pole double throw) switches and a common terminal is connected to any one of terminals a and b in accordance with a control signal A/B. In a brief description, the control signal A/B is a pulse signal in which a duty ratio is substantially 50%, for example, and the frequency thereof is set to be about 20 times the frequency of the original drive signals COM-A1 to COM-A4 and COM-B1 to COM-B4. Such a control signal A/B may be generated by an internal oscillator (not illustrated) in the auxiliary power supply circuit 50 or may be supplied from the control unit 10 through the flexible cable 190.

The capacitive elements C61, C1b, C2b, C3b, C4b, and C5b are used for charge transfer. The capacitive elements C61, C62, C63, C64, C65, and C66 are used for backup. Therefore, the capacitive element C61 serves as an element for both the charge transfer and the backup.

Practically, the above switches are configured by combining the transistors in a semiconductor integrated circuit, and the capacitive elements are mounted on the semiconductor integrated circuit externally. It is desired that the semiconductor integrated circuit have a configuration in which the plurality of drivers 30 described above is also formed.

In the auxiliary power supply circuit 50, the voltage Vp is supplied to one end of the capacitive element C66 and to a terminal a of the switch Sw6u. A common terminal of the switch Sw6u is connected to one end of the capacitive element C5b and the other end of the capacitive element C5b is connected to a common terminal of the switch Sw6d. A terminal a of the switch Sw6d is connected to one end of the capacitive element C65 and to a terminal a of the switch Sw5u. A common terminal of the switch Sw5u is connected to one end of the capacitive element C4b and the other end of the capacitive element C4b is connected to a common terminal of the switch Sw5d. A terminal a of the switch Sw5d is connected to one end of the capacitive element C64 and to a terminal a of the switch Sw4u. A common terminal of the switch Sw4u is connected to one end of the capacitive element C3b and the other end of the capacitive element C3b is connected to a common terminal of the switch Sw4d. A terminal a of the switch Sw4d is connected to one end of the capacitive element C63 and to a terminal a of the switch Sw3u. A common terminal of the switch Sw3u is connected to one end of the capacitive element C2b and the other end of the capacitive element C2b is connected to a common terminal of the switch Sw3d. A terminal a of the switch Sw3d is connected to one end of the capacitive element C62 and to a terminal a of the switch Sw2u. A common terminal of the switch Sw2u is connected to one end of the capacitive element C1b and the other end of the capacitive element C1b is connected to a common terminal of the switch Sw2d. A terminal a of the switch Sw2d is connected to one end of the capacitive element C61 and to each terminal b of the switches Sw6u, Sw5u, Sw4u, Sw3u, and Sw2u. The other ends of the capacitive elements C66, C65, C64, C63, C62, and C61 and the terminals b of the switches Sw6d, Sw5d, Sw4d, Sw3d, and Sw2d are commonly grounded to the voltage G.

Figure 23A:
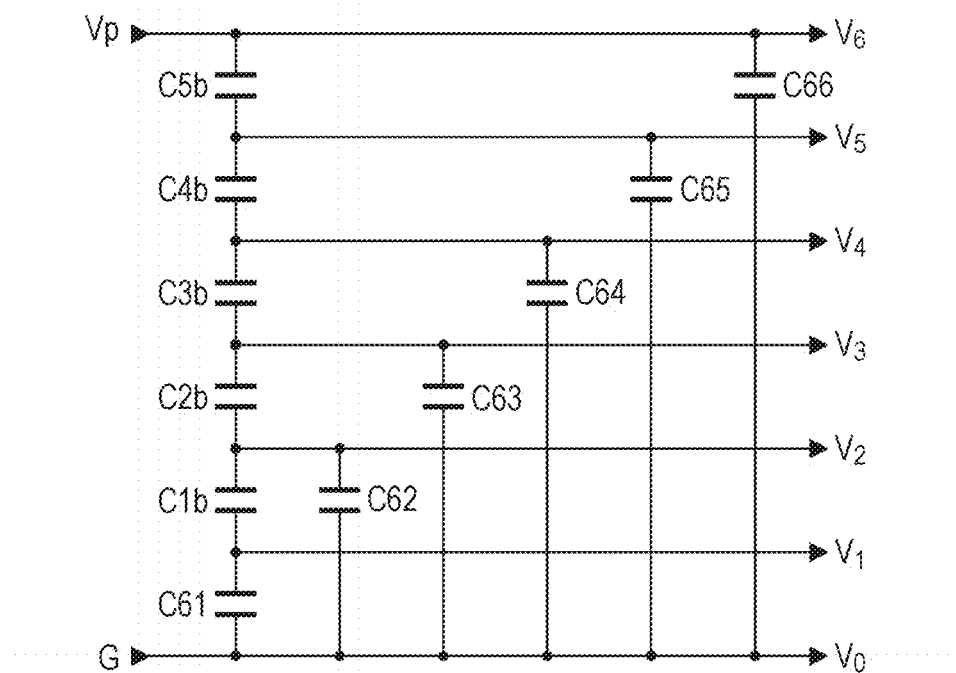
FIGS. 23A and 23B are diagrams illustrating operations of the auxiliary power supply circuit.
Figure 23B:
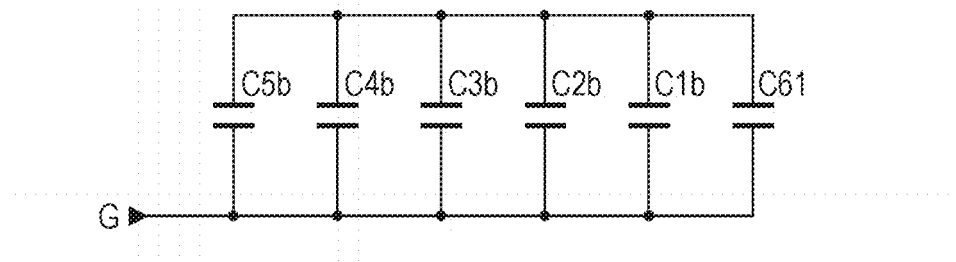

FIGS. 23A and 23B are diagrams illustrating the connection status of the switches in the auxiliary power supply circuit 50.

Each switch has two statuses of a status (status A) in which the common terminal is connected to the terminal a by the control signal A/B and a status (status B) in which the common terminal is connected to the terminal b. FIG. 23A illustrates the connection of the status A in the auxiliary power supply circuit 50 and FIG. 23B illustrates the connection of the status B by using equivalent circuits in a simplified manner, respectively.

In the status A, the capacitive elements C5b, C4b, C3b, C2b, C1b, and C61 are connected in series between the voltages Vp and G. Therefore, the status A may be called a series status. When capacities in the capacitive elements C5b, C4b, C3b, C2b, C1b, and C61 are the same, a hold voltage of each capacitive element becomes Vp/6 in the series status.

Meanwhile, in the status B, one-side ends of the capacitive elements C5b, C4b, C3b, C2b, C1b, and C61 are commonly connected to one another. Therefore, the status B may be called a parallel status. Since, in the status B, the capacitive elements C5$b$, C4$b$, C3$b$, C2$b$, C1$b$, and C61 are connected in parallel to one another, and thus the hold voltage is equalized to a hold voltage Vp/6.

When the statuses A and B are alternately repeated, the voltage Vp/6 equalized in the status B becomes one to six times as high by the series status of the status A, is held in the capacitive elements C61 to C66, respectively, and is output as the voltages $V_1$ to $V_6$.

When the piezoelectric element 40 is charged by the driver 30, the hold voltage is lowered in some of the capacitive elements C61 to C66 in the auxiliary power supply circuit 50. However, the capacitive element, in which the hold voltage is lowered, is replenished with a charge from the main power supply circuit 180 (refer to FIG. 1) by the series connection of the status A, and is redistributed and equalized by the parallel connection of the status B.

Meanwhile, when the piezoelectric element 40 is discharged by the driver 30, the hold voltage is increased in some of the capacitive elements C61 to C66. However, the charge is discharged by the series connection of the status A, and is redistributed and equalized by the parallel connection of the status B.

Accordingly, the charge discharged from the piezoelectric element 40 is collected in the auxiliary power supply circuit 50 and is reused as the charge for charging the piezoelectric element 40.

In general, when the capacity of the capacitive load such as the piezoelectric element 40 is represented by C and the voltage amplitude is represented by E, energy P accumulated in the capacitive load is represented by $P=(C \cdot E^2)/2$ The piezoelectric element 40 is deformed by the energy P and works, and an amount of work of discharging ink is equal to or less than 1% of the energy P. Accordingly, the piezoelectric element 40 can be considered as a simple capacity. When the capacity C is charged with a constant power, the same energy as $(C \cdot E^2)/2$ is consumed by the charge circuit. During discharging, the same energy is also consumed by the discharge circuit.

Figure 25:
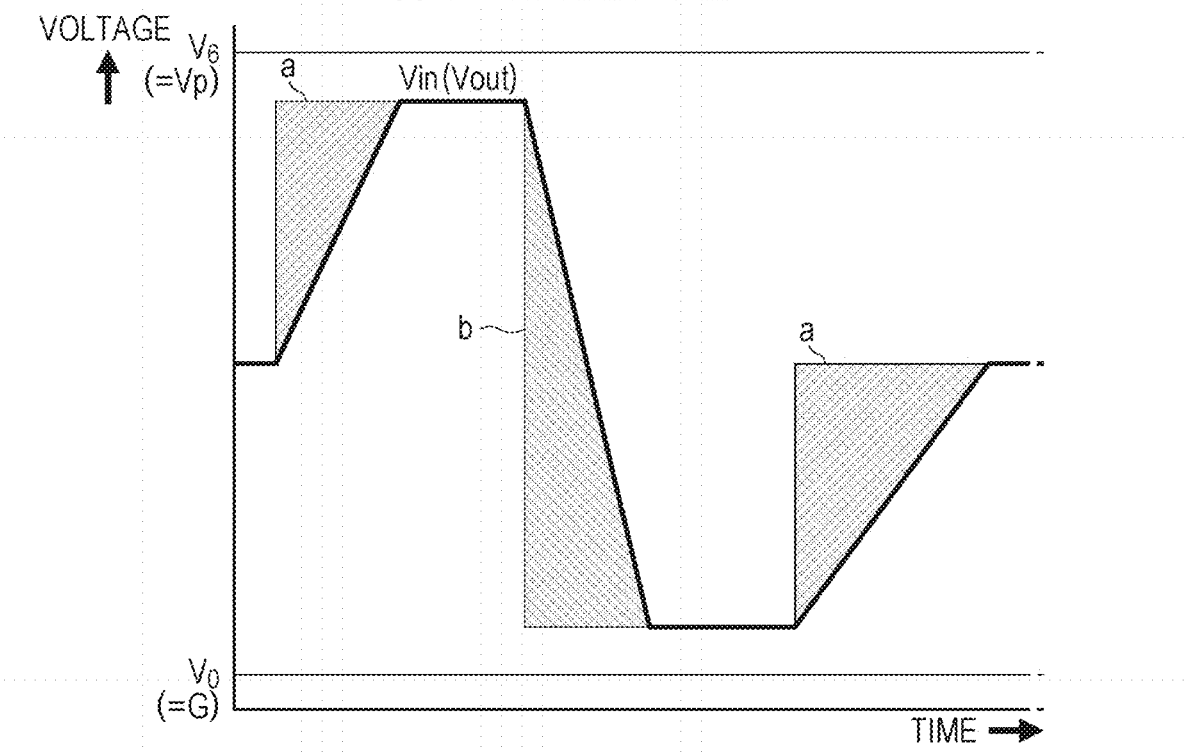
FIG. 25 is a diagram illustrating loss during charging and discharging of a piezoelectric element according to Comparative Example (1).

Here, in a case where the original drive signal Va changes in a range from the voltage Vp to the voltage G, a configuration may be assumed, in which the piezoelectric element 40 is charged and discharged without dividing the voltage (Comparative Example 1). In Comparative Example 1, a loss during the charging corresponds to the sum of areas of hatched regions a in FIG. 25 and a loss during the discharging corresponds to an area of a hatched region b in FIG. 25.

Figure 24:
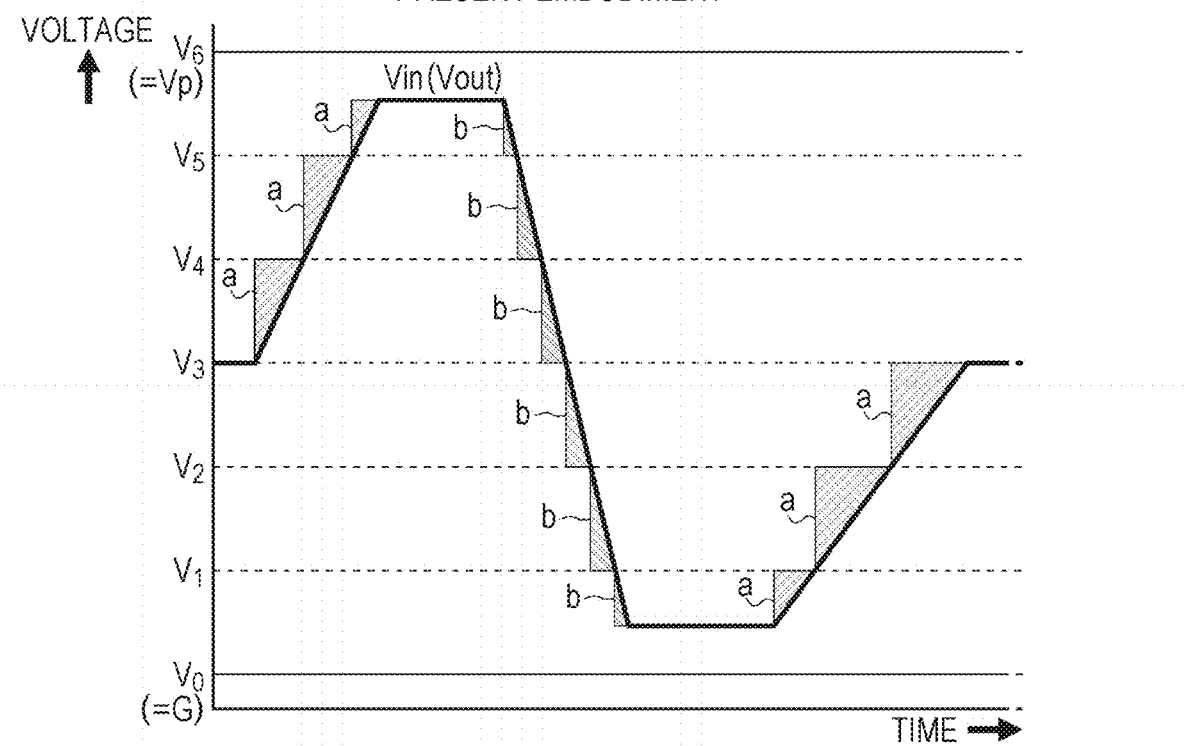
FIG. 24 is a diagram illustrating loss during charging and discharging of a piezoelectric element according to an embodiment.

In contrast, the piezoelectric element 40 is gradually charged and discharged in a stepwise manner using the voltage divided from the power supply voltages (Vp and G) into six. Therefore, it is possible to suppress the loss during the charging and the loss during the discharging to be small. To be more specific, since the loss during the charging according to the embodiment corresponds to the sum of areas of hatched regions a in FIG. 24 and the loss during the discharging corresponds to the sum of areas of hatched regions b in FIG. 24, it is possible to suppress the loss during the charging and the loss during the discharging to be small compared to Comparative Example 1.

Further, according to the present embodiment, since the charge discharged from the piezoelectric element 40 is collected by the auxiliary power supply circuit 50 and reused when the capacitive element is charged, it is possible to greatly suppress the loss as a whole to be small.

Next, the superiority of the present embodiment in the low power consumption of the driver 30 will be described from other points of view.

Figure 29:
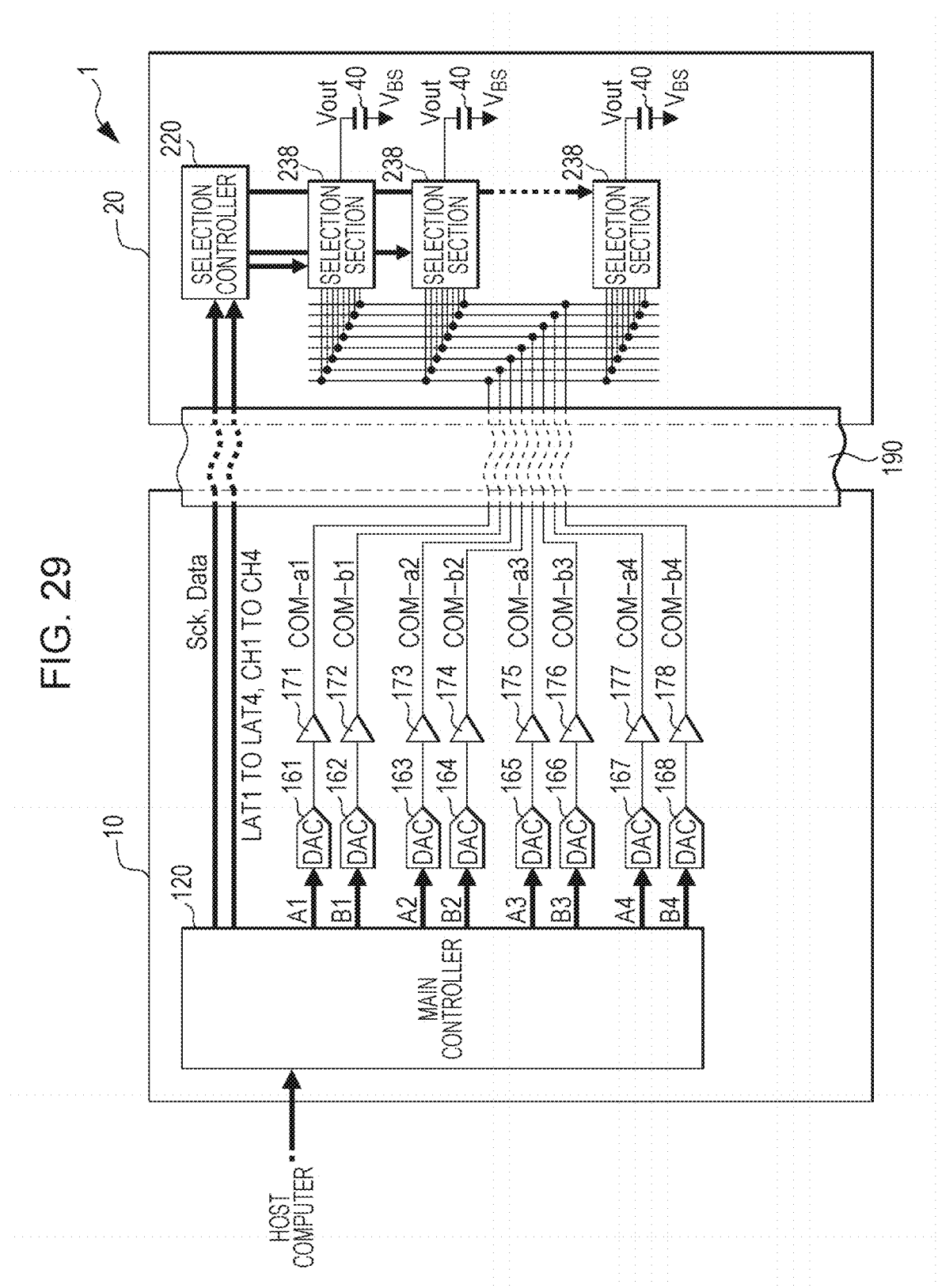
FIG. 29 is a diagram schematically illustrating a configuration of a printing apparatus according to Comparative Example (2).

FIG. 29 is a block diagram illustrating a configuration of Comparative Example (2) prepared for describing the superiority of the present embodiment.

Comparative Example (2) illustrated in FIG. 29 has a configuration in which the piezoelectric element 40 is driven not by the drive signal from the driver 30 but by the trapezoidal waveform selected by the selection section 238 from the original drive signals COM-a1 to COM-a4 and COM-b1 to COM-b4.

As described above, since the drive voltage of the piezoelectric element 40 is in the range of 0 volts to 42 volts, the outputs of the DACs 161 to 168 are amplified by amplifiers 171 to 178, respectively, and are supplied to the selection section 238 as the original drive signals COM-a1 ($b$1) to COM-a4 ($b$4).

FIG. 30A is a diagram illustrating a configuration of the selection section 238.

As illustrated in FIG. 30A, the selection section 238 is configured to have eight transfer gates 234$a$ to 234$h$ the same as in FIG. 9A. However, since the voltage range of the original drive signals COM-a1 to COM-a4 and COM-b1 to COM-b4 according to Comparative Example (2) is in the range of 0 volts to 42 volts, it is not possible to configure with the transistors and inverters in which the P type and the N type are combined in a complementary manner.

Specifically, as illustrated in FIG. 30B, in addition to two transistors, a floating circuit 239 is needed separately in Comparative Example (2). Since detailed descriptions of the floating circuit 239 are provided in FIG. 1 in JP-A-2004-363997 or the like, a description of the floating circuit 239 is omitted. The floating circuit 239 not only consumes a great current, but also needs a great circuit size. Further, eight floating circuits 239 or the like are needed for one nozzle 451 (piezoelectric element 40) in Comparative Example (2). Therefore, in a case of many nozzles, power consumption or an increased size of the circuit may not be ignored.

In addition, since the amplifiers 171 to 178 in Comparative Example (2) are shared by all of the nozzles 451 (piezoelectric elements 40), high drive performance (low output impedance) is required. Therefore, the power consumption, emitted heat, disposition space, or the like of the amplifiers 171 to 178 may become problems.

In contrast, according to the present embodiment, the driver 30 corresponding to the piezoelectric element 40 is configured to amplify the voltage of the original drive signal Vin at the input end. The charge and discharge of the piezoelectric element 40 by the driver 30 is performed by connecting ends of the auxiliary power supply circuit 50 and the piezoelectric element 40 to each other passing through the wires 510 to 516 by the transistor 341 or 342. Therefore, the high drive performance is not required by the operational amplifier 32, and thus it is possible to miniaturize the element itself.

Further, according to the present embodiment, since the voltage range of the original drive signals COM-A1 to COM-A4 and COM-B1 to COM-B4 input from the selection section 230 is in the range of 0 volts to 4.2 volts, and thus it is a low amplitude compared to Comparative Example (2), it is possible to configure with the transistors and inverters in which the simple P type and N type are combined in a complementary manner. Therefore, it is easy to save power consumption or to reduce a size of the circuit in the selection section 230.

In addition, unlike Comparative Example (2), since the amplifiers 171 to 178 are not required in the present embodiment, there are no problems such as the power consumption, emitted heat, disposition space, or the like of the amplifiers 171 to 178 at all.

As described above, it is effective that, without lowering the printing speed, the number of drive timing systems is increased in order to increase the resolution. Since it is possible to achieve the miniaturization of the elements, particularly the miniaturization of the selection section 230 in the present embodiment, it is easy to increase the number of the systems. Accordingly, in the present embodiment, it is also possible to achieve a high resolution easily without lowering the printing speed.

When the amplifiers 171 to 178 in Comparative Example (2) are relocated between the selection section 238 and the piezoelectric element 40, it is possible to configure the selection section 238 to be the same as in the present embodiment. However, since the amplifier has a configuration in which the piezoelectric element 40 is charged and discharged without dividing the voltage in the range from the voltage Vp to the voltage G, that is, a configuration of Comparative Example (1), attention has to be paid in that it is not possible to achieve the low power consumption unlike the driver 30 in the present embodiment.

Figure 26:
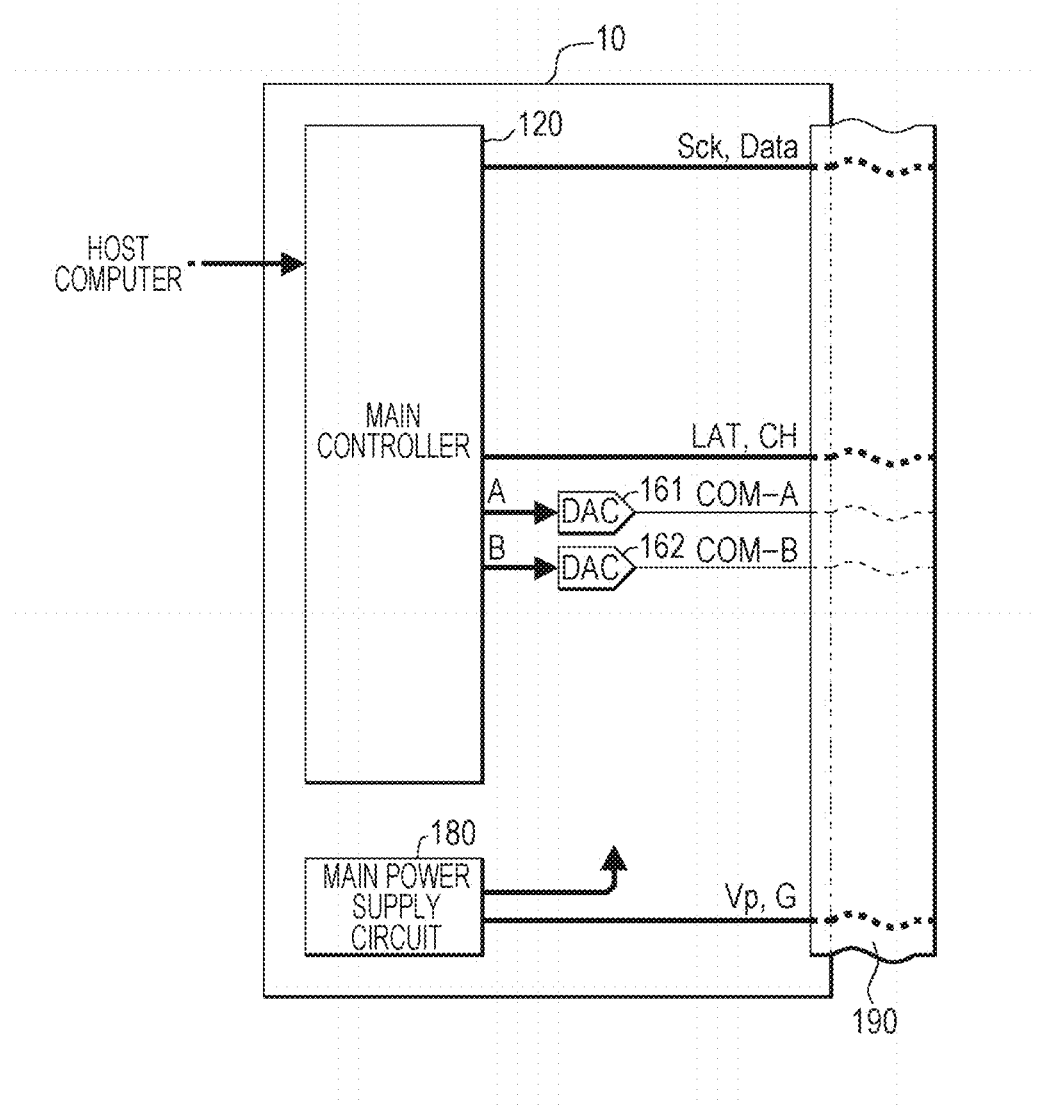
FIG. 26 is a block diagram illustrating a configuration of a control unit according to Application Example (1).
Figure 27:
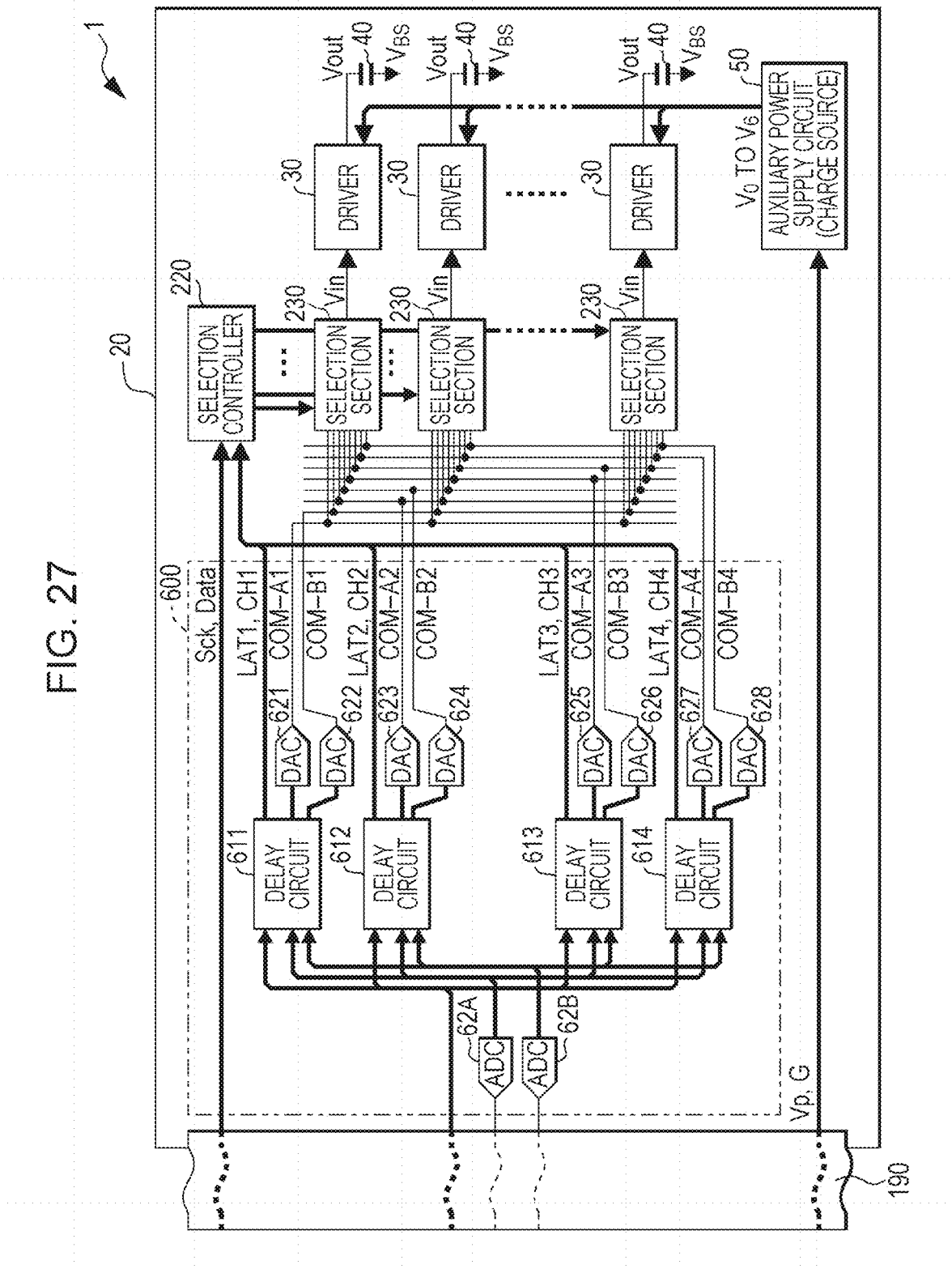
FIG. 27 is a block diagram illustrating a configuration of a head unit according to Application Example (1).

FIG. 26 and FIG. 27 are block diagrams illustrating a configuration of a printing apparatus according to another embodiment (Application Example 1) of the invention. Specifically, FIG. 26 illustrates a configuration of the control unit 10 and FIG. 27 illustrates a configuration of the head unit 20.

Schematically, Application Example (1) is configured to generate the original drive signal or the like that regulates the drive timings by the head unit 20 side.

To be more specific, in FIG. 26, the main controller 120 outputs digital data pieces A and B, the DAC 161 converts the digital data A into an original analog drive signal COM-A, and the DAC 162 converts the digital data B into an analog original drive signal COM-B. In addition, the main controller 120 supplies the clock signal Sck, the data signal Data, and the control signals LAT and CH to the head unit 20.

The original analog drive signals COM-A and COM-B and the control signals LAT and CH are simply signals obtained in a case where the drive timing is the first system, and, with these signals as original, the head unit 20 is configured to generate signals of the four systems.

As illustrated in FIG. 27, the head unit 20 is different from that in the embodiment (refer to FIG. 1) in that the delay unit 600 surrounded by the two-dot chain line is provided.

The delay unit 600 includes ADCs 62A and 62B, delay circuits 611 to 614, and DACs 621 to 628.

The analog to digital converter (ADC) 62A reconverts the analog original drive signal COM-A supplied from the control unit 10 into a digital signal. The ADC 62B reconverts the analog original drive signal COM-B into a digital signal. As long as the main controller 120 is configured to be capable of supplying the digital data A and B directly to the head unit 20, the main controller 120 may be configured to input the digital data A and B.

The delay circuit 611 delays the control signals LAT and CH and the original drive signals COM-A and COM-B by a predetermined time and outputs digital data (corresponding to A1 and B1) which is an origin of the original drive signals COM-A1 and COM-B1, along with the control signals LAT1 and CH1 of the first system. When the DACs 621 and 622 convert the digital data into analog signals, respectively, the original drive signals COM-A1 and COM-B1 are generated.

The delay circuit 612 delays the input control signals LAT and CH and original drive signals COM-A and COM-B by 90 degrees in the phase with respect to the first system and outputs digital data (corresponding to A2 and B2) which is an origin of the original drive signals COM-A2 and COM-B2, along with the control signals LAT2 and CH2 of the second system. Therefore, the DACs 623 and 624 output the original drive signals COM-A2 and COM-B2, respectively.

The delay circuit 613 delays the control signals LAT and CH and original drive signals COM-A and COM-B by 90 degrees in the phase with respect to the second system (by 180 degrees in the phase with respect to the first system) and outputs digital data (corresponding to A3 and B3) which is an origin of the original drive signals COM-A3 and COM-B3, along with the control signals LAT3 and CH3 of the third system. Therefore, the DACs 625 and 626 output the original drive signals COM-A3 and COM-B3, respectively.

Similarly, the delay circuit 614 delays the control signals LAT and CH and original drive signals COM-A and COM-B by 90 degrees in the phase with respect to the third system (by 270 degrees in the phase with respect to the first system) and outputs digital data (corresponding to A4 and B4) which is an origin of the original drive signals COM-A4 and COM-B4, along with the control signals LAT4 and CH4 of the fourth system. Therefore, the DACs 627 and 628 output the original drive signals COM-A4 and COM-B4, respectively.

The phase of the original drive signal COM-A2 is delayed by 90 degrees from the original drive signal COM-A1 that is the first original drive signal by the delay circuit 612 of the delay unit 600. Similarly, the phase of the original drive signal COM-B2 is delayed by 90 degrees from the original drive signal COM-B1 that is the second original drive signal. Therefore, the original drive signal COM-A2 becomes the third drive signal and the original drive signal COM-B2 becomes the fourth drive signal.

The next stages of the delay unit 600 have the same configurations as in the embodiment (refer to FIG. 1). In addition, practically, an oscillation circuit for counting the delaying time in the delay circuits 611 to 614, a register for holding the delaying time, or the like is needed, but is omitted in FIG. 27.

According to Application Example (1), it is possible to simplify the configuration of the control unit 10 (or the control unit in the related art can be used). An amount of the delay in the delay circuits 611 to 614 may be controllable by the control unit 10 in the configuration.

Figure 28:
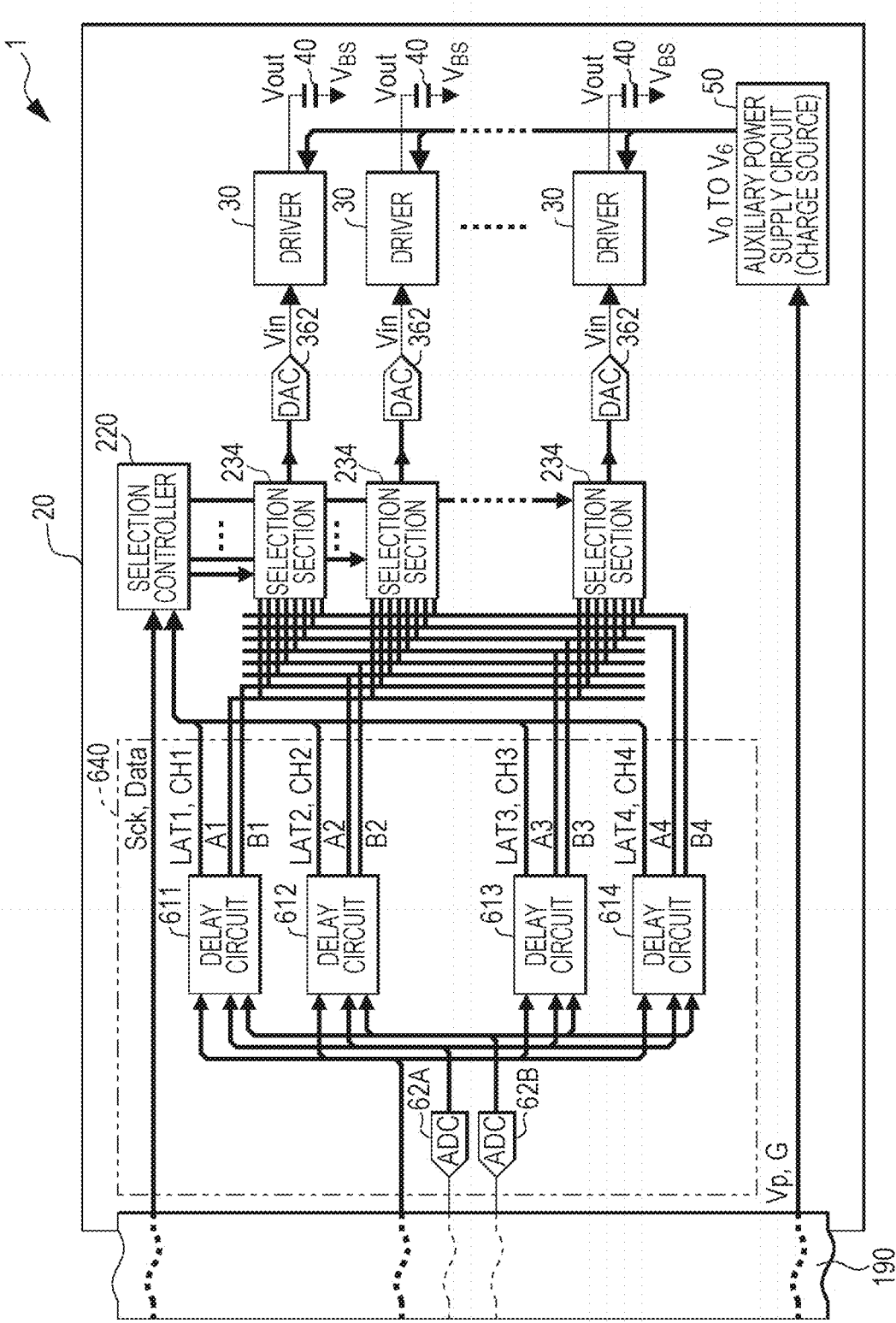
FIG. 28 is a block diagram illustrating a configuration of a head unit according to Application Example (2).

FIG. 28 is a block diagram illustrating a configuration of the head unit 20 of the printing apparatus according to still another embodiment (Application Example 2) of the invention.

The control unit 10 according to Application Example (2) is common with that in FIG. 26.

Schematically, Application Example (2) is configured to perform processing on a selection of the selection section into a digital signal in addition to an analog signal and then convert the processed signal into an analog signal.

According to Application Example (2), the DAC is not included in the delay unit 640. Therefore, Application Example (2) has a configuration in which the digital data pieces A1 to A4 and B1 to B4 (which are the origins of the original drive signals COM-A1 to COM-A4 and COM-B1 to COM-B4) output from the delay circuits 611 to 614 are directly supplied to the selection sections 234 corresponding to the sets of the driver 30 and the piezoelectric element 40.

The selection section 234 selects any one of the digital data pieces A1 to A4 and B1 to B4 in accordance with the instruction of the selection controller 220. Therefore, the selection section 234 may be configured to have not only the transfer gates as in the embodiment or Application Example (1), but also a simple data selector.

The DAC 362 converts the selected digital data by the selection section 234 into an analog signal and supplies the analog signal to the driver 30 as the original drive signal Vin.

According to the apex (2), the DAC 362 is needed for each piezoelectric element 40, but it is possible to perform the digital process on the process between the ADCs 62A and 62B and the DAC 362. Therefore, the lower power consumption and smaller size of the circuit can be achieved.

Modification Example

The invention is not limited to the above described embodiments, but can be subjected to various modifications as will be described later. Aspects of modification which will be described later may be used as one aspect selected randomly or a plurality of the aspects selected randomly may be appropriately combined.

Duplicating Operation of Unit Circuit

In the driver 30 described above, when the voltages Vout during the increase or drop of the voltage of the original drive signal Vin approach the voltages $V_0$, $V_1$, $V_2$, $V_3$, $V_4$, $V_5$, and $V_6$, the current is unlikely to flow in the transistors 341 and 342.

For example, in the driver 30, during the increase of the voltage (or voltage Vout) of the original drive signal Va, when the voltage of the original drive signal Va approaches the voltage $V_1$, the current is unlikely to flow in the transistor 341 in the unit circuit 34a (because the voltage between the base-emitter is low).

During the increase of the voltage of the original drive signal Va, in a case where the voltage of the original drive signal Va approaches the voltage $V_1$, not only the transistor 341 in the unit circuit 34a but also the transistor 341 in the unit circuit 34b which is one stage higher may supply the current to the piezoelectric element 40 through the wire 512.

Similarly, for example, during the drop of the voltage of the original drive signal Va, when the voltage of the original drive signal Va approaches the voltage $V_1$, the current is unlikely to flow in the transistor 342 in the unit circuit 34b. During the drop of the voltage of the original drive signal Va, when the voltage of the original drive signal Va approaches the voltage $V_1$, the current may be supplied to the wire 510 from the piezoelectric element 40 through not only the transistor 342 in the unit circuit 34b but also the transistor 342 in the unit circuit 34a which is one stage lower.

Operation Target

According to the embodiment, an example of the piezoelectric element 40 that discharges ink is described as a drive target of the driver 30. According to the invention, the drive target is not limited to the piezoelectric element 40, but, for example, may be any load which has a capacitive component such as an ultrasonic motor, a touch panel, an electrostatic loudspeaker, or a liquid crystal panel.

The Number of Stages of Unit Circuit or the Like

The embodiment has a configuration in which the six stages of the unit circuits 34a to 34f are provided in ascending order of the voltages such that the adjacent two voltages correspond to each other out of the six types of voltages. However, according to the invention, the number of the unit circuits 34 is not limited thereto as described in Application Example (2), but may be two or more. The greater the number of the unit circuits 34, the less the loss during the charging and discharging, but the more complex the configuration.

In addition, the transistors 341 and 342 in the unit circuit 34 are not limited to the bipolar type, but may be metal-oxide-semiconductor field-effect transistors (MOSFET), respectively.

What is claimed is:

1. A liquid discharge apparatus comprising:
an original drive signal generator that generates a plurality of original drive signals which includes a first original drive signal and a second original drive signal;
a selector that is capable of selecting one original drive signal from the plurality of original drive signals which includes the first original drive signal and the second original drive signal;
a driver that generates a drive signal by amplifying the one original drive signal;
a piezoelectric element that is displaced according to the drive signal;
a cavity of which an inside volume is changed due to the displacement of the piezoelectric element; and
a nozzle that is provided to discharge a liquid in the cavity according to the change of the inside volume of the cavity,
wherein the selector and the piezoelectric element are electrically connected via the driver.

2. The liquid discharge apparatus according to claim 1, further comprising:
a charge source that supplies a charge;
a first signal path to which a first voltage is applied by the charge source; and
a second signal path to which a second voltage that is higher than the first voltage is applied by the charge source,
wherein the driver causes the piezoelectric element and the charge source to be electrically connected to each other through at least one of the first signal path and the second signal path according to the voltage in accordance with the one original drive signal and a hold voltage of the piezoelectric element.

3. The liquid discharge apparatus according to claim 1, wherein the original drive signal generator includes:
a delay circuit that outputs a third original drive signal which is generated by delaying the first original drive signal and outputs a fourth original drive signal which is generated by delaying the second original drive signal, and
wherein the selector is capable of selecting any one of the plurality of original drive signals which includes the first original drive signal, the second original drive signal, the third original drive signal, and the fourth original drive signal.

4. The liquid discharge apparatus according to claim 3, wherein the selector inputs, as analog signals, the plurality of original drive signals which includes the first original drive signal, the second original drive signal, the third original drive signal, and the fourth original drive signal so as to be capable of selecting any one of the original drive signals.

5. The liquid discharge apparatus according to claim 3, further comprising:
a D/A converter that corresponds to the selector,
wherein the selector is provided to input, as digital signals, the plurality of original drive signals which includes the first original drive signal, the second original drive signal, the third original drive signal, and the fourth original drive signal so as to be capable of selecting any one of the original drive signals, and wherein the D/A converter converts the one original drive signal into an analog signal and supplies the converted analog signal to the driver.

\* \* \* \* \*